(12) United States Patent
Onose

(10) Patent No.: US 10,879,663 B2
(45) Date of Patent: Dec. 29, 2020

(54) SOLID-STATE LASER SYSTEM AND WAVELENGTH CONVERSION SYSTEM

(71) Applicant: Gigaphoton Inc., Tochigi (JP)

(72) Inventor: Takashi Onose, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 3 days.

(21) Appl. No.: 16/534,722

(22) Filed: Aug. 7, 2019

(65) Prior Publication Data

US 2019/0363504 A1 Nov. 28, 2019

Related U.S. Application Data

(63) Continuation of application No. PCT/JP2017/008220, filed on Mar. 2, 2017.

(51) Int. Cl.
*H01S 3/10* (2006.01)
*H01S 3/00* (2006.01)
(Continued)

(52) U.S. Cl.
CPC .............. *H01S 3/0092* (2013.01); *G02F 1/37* (2013.01); *H01S 3/10007* (2013.01);
(Continued)

(58) Field of Classification Search
CPC .............. H01S 3/0092; H01S 3/06754; H01S 3/10007; H01S 3/2308; H01S 3/1618;
(Continued)

(56) References Cited

U.S. PATENT DOCUMENTS 6,219,363 B1 4/2001 Fix et al.
2003/0012233 A1* 1/2003 Kobayashi ............ H01S 3/0823
372/25
(Continued)

FOREIGN PATENT DOCUMENTS

JP H07-170009 A 7/1995
JP 2004-06434 A 1/2004
(Continued)

OTHER PUBLICATIONS

International Search Report issued in PCT/JP2017/008220; dated May 30, 2017.
International Preliminary Report on Patentability and Written Opinion issued in PCT/JP2017/008220; dated Sep. 3, 2019.

*Primary Examiner* — Kinam Park
(74) *Attorney, Agent, or Firm* — Studebaker & Brackett PC

(57) ABSTRACT

A solid-state laser system includes: a first solid-state laser device configured to output a first pulse laser beam; a second solid-state laser device configured to output a second pulse laser beam; a first non-linear crystal disposed on a first optical path and configured to convert the first and second pulse laser beams into a third pulse laser beam and output the third pulse laser beam; and a second non-linear crystal disposed on a second optical path and configured to convert the second and third pulse laser beams into a fourth pulse laser beam and output the fourth pulse laser beam. The second pulse laser beam is incident on the second non-linear crystal at a first timing before the first non-linear crystal. Residual light of the second pulse laser beam is incident on the first non-linear crystal at a second timing later than the first timing.

14 Claims, 15 Drawing Sheets

(51) Int. Cl.
- *G02F 1/37* (2006.01)
- *H01S 3/16* (2006.01)
- *H01S 3/23* (2006.01)
- *H01S 5/00* (2006.01)
- *H01S 5/125* (2006.01)
- *H01S 5/187* (2006.01)

(52) U.S. Cl.
CPC .......... *H01S 3/1666* (2013.01); *H01S 3/2308* (2013.01); *H01S 5/0092* (2013.01); *H01S 3/16* (2013.01); *H01S 3/1618* (2013.01); *H01S 3/1643* (2013.01); *H01S 5/125* (2013.01); *H01S 5/187* (2013.01)

(58) Field of Classification Search
CPC ........ H01S 3/1643; H01S 3/1666; H01S 3/16; H01S 5/0092; H01S 5/125; H01S 5/187
See application file for complete search history.

(56) References Cited

U.S. PATENT DOCUMENTS

| | | | |
|---|---|---|---|
| 2005/0185683 A1* | 8/2005 | Ohtsuki | G03F 7/70575 372/26 |
| 2012/0228501 A1* | 9/2012 | Qian | G01J 11/00 250/338.1 |
| 2016/0240993 A1* | 8/2016 | Tokuhisa | H01S 3/10015 |
| 2017/0338617 A1* | 11/2017 | Zhao | H01S 3/06754 |
| 2019/0305508 A1* | 10/2019 | Onose | H01S 3/109 |

FOREIGN PATENT DOCUMENTS

| | | |
|---|---|---|
| JP | 2009-58782 A | 3/2009 |
| JP | 2009-145791 A | 7/2009 |
| NO | 2016/143071 A1 | 9/2016 |
| WO | 01/20651 A1 | 3/2001 |

* cited by examiner

SOLID-STATE LASER SYSTEM AND WAVELENGTH CONVERSION SYSTEM

CROSS-REFERENCE TO RELATED APPLICATIONS

The present application is a continuation application of International Application No. PCT/JP2017/008220 filed on Mar. 2, 2017. The content of the application is incorporated herein by reference in its entirety.

BACKGROUND

1. Technical Field

The present disclosure relates to a solid-state laser system and a wavelength conversion system.

2. Related Art

Recently, in a semiconductor exposure apparatus (hereinafter referred to as "exposure apparatus"), resolving power improvement has been requested along with miniaturization and high integration of a semiconductor integrated circuit. Thus, the wavelength of light discharged from an exposure light source has been shortened. Typically, a gas laser apparatus is used as the exposure light source in place of a conventional mercury lamp. Examples of the gas laser apparatus for exposure include a KrF excimer laser apparatus configured to output an ultraviolet laser beam having a wavelength of 248 nm, and an ArF excimer laser apparatus configured to output an ultraviolet laser beam having a wavelength of 193 nm.

Immersion exposure in which a space between an exposure lens on the exposure apparatus side and a wafer is filled with liquid has been practically used as a next generation exposure technology. In the immersion exposure, the apparent wavelength of the exposure light source is shortened due to change of the refractive index of the space between the exposure lens and the wafer. When the immersion exposure is performed by using the ArF excimer laser apparatus as the exposure light source, the wafer is irradiated with ultraviolet light having a wavelength of 134 nm in the water. This technology is called ArF immersion exposure (or ArF immersion lithography).

The KrF excimer laser apparatus and the ArF excimer laser apparatus each have a wide spontaneous oscillation width of 350 pm to 400 pm approximately. Thus, chromatic aberration occurs in some cases when a projection lens is made of a material that transmits ultraviolet such as KrF and ArF laser beams. This can lead to resolving power decrease. Thus, the spectrum line width of a laser beam output from the gas laser apparatus needs to be narrowed so that chromatic aberration becomes negligible. To narrow the spectrum line width, a line narrow module (LNM) including a line narrow element (for example, etalon or grating) is provided in a laser resonator of the gas laser apparatus in some cases. In the following, a laser apparatus that achieves narrowing of the spectrum line width is referred to as a line narrow laser apparatus.

LIST OF DOCUMENTS

Patent Documents

Patent Document 1: International Patent Publication No. 2016/143071
Patent Document 2: International Patent Publication No. 2001/020651
Patent Document 3: Japanese Unexamined Patent Application Publication No. 2009-145791
Patent Document 4: Japanese Unexamined Patent Application Publication No. 7-170009

SUMMARY

A solid-state laser system of the present disclosure includes: a first solid-state laser device configured to output a first pulse laser beam having a first wavelength; a second solid-state laser device configured to output a second pulse laser beam having a second wavelength; a first non-linear crystal disposed on a first optical path through which the first pulse laser beam and the second pulse laser beam travel and configured to perform wavelength conversion of the first pulse laser beam and the second pulse laser beam into a third pulse laser beam having a third wavelength through a sum frequency generation process and output the third pulse laser beam; and a second non-linear crystal disposed on a second optical path through which the second pulse laser beam and the third pulse laser beam travel and configured to perform wavelength conversion of the second pulse laser beam and the third pulse laser beam into a fourth pulse laser beam having a fourth wavelength through a sum frequency generation process and output the fourth pulse laser beam. The second pulse laser beam is caused to be incident on the second non-linear crystal at a first timing before the second pulse laser beam is incident on the first non-linear crystal. Residual light of the second pulse laser beam, which has not been used in the sum frequency generation process and has passed through the second non-linear crystal, is caused to be incident on the first non-linear crystal at a second timing later than the first timing.

A wavelength conversion system of the present disclosure includes: a first non-linear crystal disposed on a first optical path through which a first pulse laser beam having a first wavelength and a second pulse laser beam having a second wavelength travel and configured to perform wavelength conversion of the first pulse laser beam and the second pulse laser beam into a third pulse laser beam having a third wavelength through a sum frequency generation process and output the third pulse laser beam; and a second non-linear crystal disposed on a second optical path through which the second pulse laser beam and the third pulse laser beam travel and configured to perform wavelength conversion of the second pulse laser beam and the third pulse laser beam into a fourth pulse laser beam having a fourth wavelength through a sum frequency generation process and output the fourth pulse laser beam. The second pulse laser beam is caused to be incident on the second non-linear crystal at a first timing before the second pulse laser beam is incident on the first non-linear crystal. Residual light of the second pulse laser beam, which has not been used in the sum frequency generation process and has passed through the second non-linear crystal, is caused to be incident on the first non-linear crystal at a second timing later than the first timing.

BRIEF DESCRIPTION OF THE DRAWINGS

Embodiments of the present disclosure will be described below as examples with reference to the accompanying drawings.

DESCRIPTION OF EMBODIMENTS

<Contents>
<1. Comparative example> (exposure-apparatus laser apparatus including solid-state laser system) (FIGS. 1 to 5)
 1.1 Exposure-apparatus laser apparatus
  1.1.1 Configuration
  1.1.2 Operation
 1.2 Details of wavelength conversion system
  1.2.1 Configuration
  1.2.2 Operation
  1.2.3 Modification
 1.3 Problem
 1.4 Summary of embodiments
<2. Embodiment 1> (first exemplary solid-state laser system) (FIGS. 6 and 7)
 2.1 Configuration
 2.2 Operation
 2.3 Effect <3. Embodiment 2> (second exemplary solid-state laser system) (FIGS. 8 and 9)
 3.1 Configuration
 3.2 Operation and effect
<4. Embodiment 3> (wavelength conversion system including ring optical path) (FIG. 10)
 4.1 Configuration
 4.2 Operation
 4.3 Effect
<5. Embodiment 4> (method of optimizing wavelength conversion efficiency) (FIGS. 11 and 12)
 5.1 Configuration and operation
 5.2 Effect
<6. Embodiment 5> (first exemplary solid-state laser system with polarization direction taken into consideration) (FIG. 13)
 6.1 Configuration
 6.2 Operation and effect
<7. Embodiment 6> (second exemplary solid-state laser system with polarization direction taken into consideration) (FIG. 14)
 7.1 Configuration
 7.2 Operation and effect
<8. Embodiment 7> (exemplary configuration of semiconductor laser and semiconductor optical amplifier) (FIG. 15)
 8.1 Configuration
 8.2 Operation
<9. Others>

Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

<1. Comparative Example> (Exposure-Apparatus Laser Apparatus Including Solid-State Laser System)

1.1 Exposure-Apparatus Laser Apparatus

The following first describes an exposure-apparatus laser apparatus including a solid-state laser system of a comparative example for embodiments of the present disclosure.

An exposure-apparatus laser apparatus includes a master oscillator (MO) and a power oscillator (PO). In such an exposure-apparatus laser apparatus, a laser using excimer laser gas as a laser medium can be used as the MO and the PO. In a currently developed exposure-apparatus laser apparatus to achieve energy saving, the MO is a solid-state laser system including a combination of a non-linear crystal and a solid-state laser and is configured to output an ultraviolet pulse laser beam. The following describes an exemplary configuration of the exposure-apparatus laser apparatus including such a solid-state laser system.

[1.1.1 Configuration]

Figure 1:
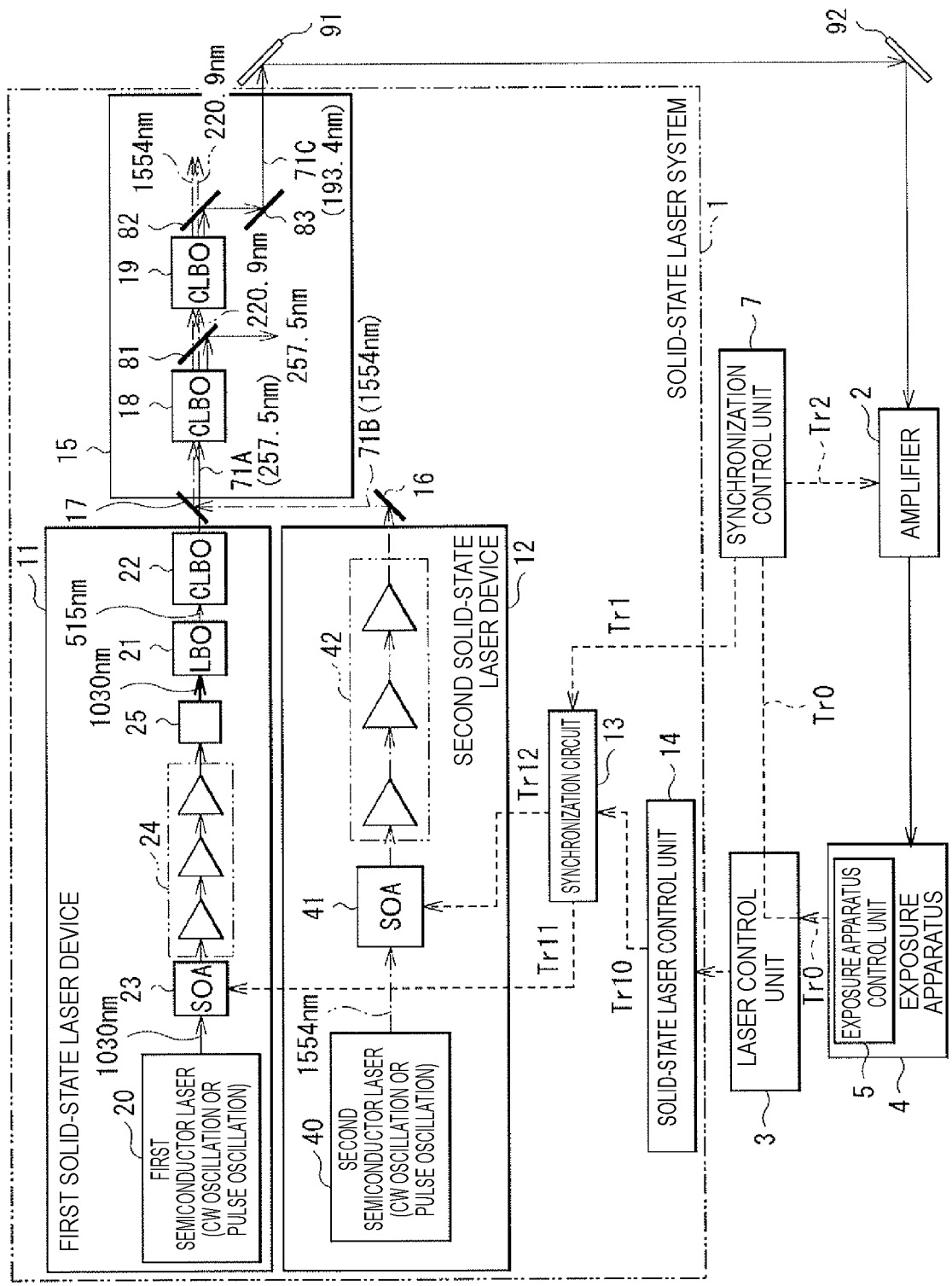
FIG. 1 schematically illustrates an exemplary configuration of an exposure-apparatus laser apparatus including a solid-state laser system according to a comparative example.
Figure 2:
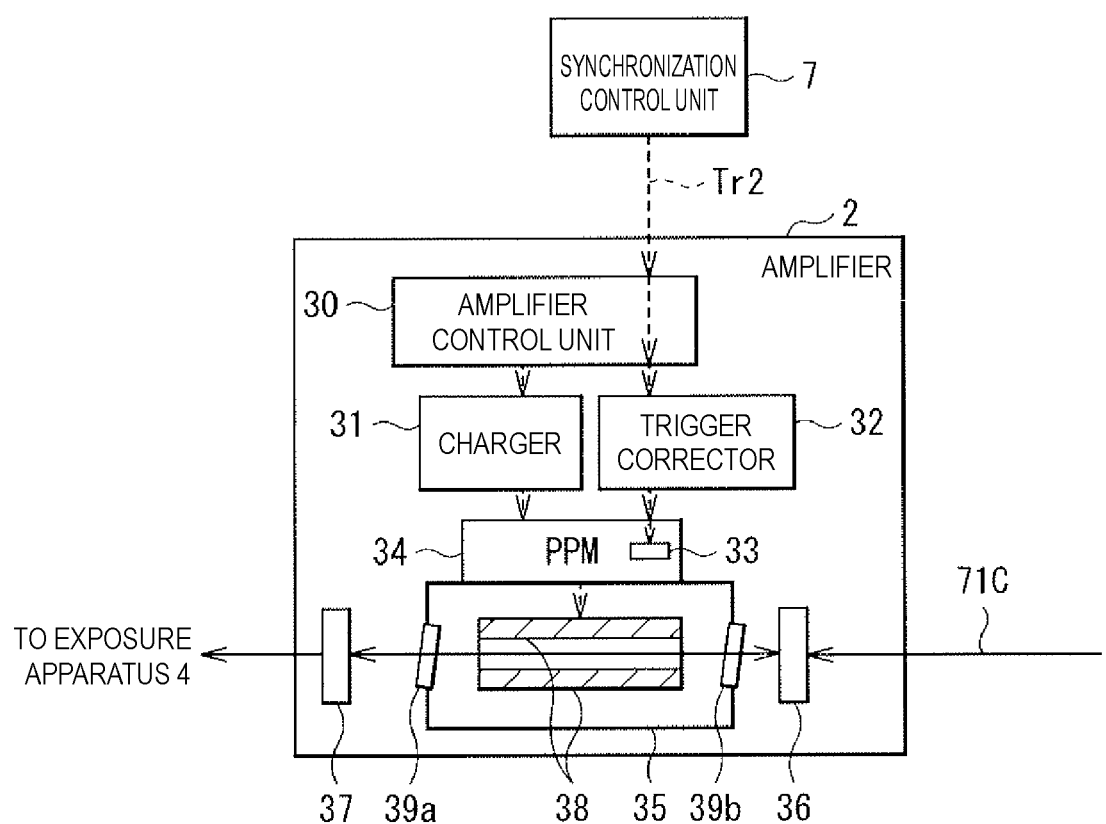
FIG. 2 schematically illustrates an exemplary configuration of an amplifier in the exposure-apparatus laser apparatus illustrated in FIG. 1.

FIG. 1 schematically illustrates an exemplary configuration of the exposure-apparatus laser apparatus including a solid-state laser system 1 according to the comparative example. FIG. 2 schematically illustrates an exemplary configuration of an amplifier 2 in the exposure-apparatus laser apparatus illustrated in FIG. 1.

The exposure-apparatus laser apparatus outputs a pulse laser beam to an exposure apparatus 4 including an exposure apparatus control unit 5. The exposure-apparatus laser apparatus includes the solid-state laser system 1, the amplifier 2 such as an ArF laser amplifier, a laser control unit 3, a synchronization control unit 7, and high reflectance mirrors 91 and 92.

The solid-state laser system 1 includes a first solid-state laser device 11, a second solid-state laser device 12, a synchronization circuit 13, a solid-state laser control unit 14, a wavelength conversion system 15, a high reflectance mirror 16, and a dichroic mirror 17. The high reflectance mirror 16 and the dichroic mirror 17 may be provided in the wavelength conversion system 15.

The first solid-state laser device 11 outputs a first pulse laser beam 71A having a first wavelength. The first wavelength may be 257.5 nm approximately. The first solid-state laser device 11 includes a first semiconductor laser 20, a first semiconductor optical amplifier (SOA) 23, a Yb fiber amplifier system 24, a Yb:YAG crystal amplifier 25, an LBO crystal ($LiB_3O_5$) 21, and a CLBO crystal ($CsLiB_6O_{10}$) 22.

The first semiconductor laser 20 may perform continuous wave (CW) oscillation or pulse oscillation at a wavelength of 1030 nm approximately. The first semiconductor laser 20 is, for example, a distributed-feedback (DFB) semiconductor laser.

The first semiconductor optical amplifier 23 is a semiconductor element configured to convert a CW or pulse seed beam into a pulse laser beam having a predetermined pulse width by causing pulse current to flow through a semiconductor under control of a current controller (not illustrated). The predetermined pulse width may be, for example, 5 ns to 20 ns approximately inclusive.

The Yb fiber amplifier system 24 includes a multi-stage optical fiber amplifier doped with Yb, and a CW excitation semiconductor laser (not illustrated) configured to emit excitation light through CW oscillation and supply the excitation light to each optical fiber amplifier.

The second solid-state laser device 12 outputs a second pulse laser beam 71B having a second wavelength. The second wavelength may be 1554 nm approximately. The second solid-state laser device 12 includes a second semiconductor laser 40, a second semiconductor optical amplifier (SOA) 41, and an Er fiber amplifier system 42.

The second semiconductor laser 40 may be a single-longitudinal-mode laser configured to perform CW oscillation or pulse oscillation at a wavelength of 1554 nm approximately. The second semiconductor laser 40 is, for example, a distributed-feedback (DFB) semiconductor laser.

The second semiconductor optical amplifier 41 is a semiconductor element configured to convert a CW or pulse seed beam into a pulse laser beam having a predetermined pulse width by causing pulse current to flow through a semiconductor under control of a current controller (not illustrated). The predetermined pulse width may be, for example, 5 ns to 20 ns approximately inclusive.

The Er fiber amplifier system 42 includes a multi-stage optical fiber amplifier doped with Er and Yb, and a CW excitation semiconductor laser (not illustrated) configured to emit excitation light through CW oscillation and supply the excitation light to each optical fiber amplifier.

The wavelength conversion system 15 includes a first CLBO crystal 18, a second CLBO crystal 19, a dichroic mirror 81, a dichroic mirror 82, and a high reflectance mirror 83.

The high reflectance mirror 16 is disposed to highly reflect the second pulse laser beam 71B output from the second solid-state laser device 12 so that the second pulse laser beam 71B is incident on the dichroic mirror 17.

The first CLBO crystal 18, the dichroic mirror 81, the second CLBO crystal 19, and the dichroic mirror 82 are disposed in the stated order on the optical path of the second pulse laser beam 71B.

The dichroic mirror 17 is coated with a film that highly transmits the first pulse laser beam 71A having a wavelength of 257.5 nm approximately and highly reflects the second pulse laser beam 71B having a wavelength of 1554 nm approximately. The dichroic mirror 17 is disposed so that the first pulse laser beam 71A and the second pulse laser beam 71B are incident on the wavelength conversion system 15 while the optical path axes thereof are substantially aligned with each other.

The first CLBO crystal 18 is disposed on a first optical path through which the first pulse laser beam 71A having a wavelength of 257.5 nm approximately and the second pulse laser beam 71B having a wavelength of 1554 nm approximately travel. The first CLBO crystal 18 is a first non-linear crystal configured to perform wavelength conversion of the first pulse laser beam 71A and the second pulse laser beam 71B into a third pulse laser beam having a third wavelength through a sum frequency generation (SFG) process and to output the third pulse laser beam. The third wavelength may be 220.9 nm approximately.

The second CLBO crystal 19 is disposed on a second optical path through which the second pulse laser beam 71B having a wavelength of 1554 nm approximately and the third pulse laser beam having a wavelength of 220.9 nm approximately travel. The second CLBO crystal 19 is a second non-linear crystal configured to perform wavelength conversion of the second pulse laser beam 71B and the third pulse laser beam into a fourth pulse laser beam 71C having a fourth wavelength through a sum frequency generation process and to output the fourth pulse laser beam. The fourth wavelength may be 193.4 nm approximately.

The dichroic mirror 81 is coated with a film that highly reflects the first pulse laser beam 71A having a wavelength of 257.5 nm approximately and highly transmits the second pulse laser beam 71B having a wavelength of 1554 nm approximately and the third pulse laser beam having a wavelength of 220.9 nm approximately. The pulse laser beam having a wavelength of 220.9 nm approximately and incident on the dichroic mirror 81 is the third pulse laser beam output from the first CLBO crystal 18 and is a pulse laser beam having a sum frequency of the first pulse laser beam 71A having a wavelength of 257.5 nm approximately and the second pulse laser beam 71B having a wavelength of 1554 nm approximately.

The dichroic mirror 82 is disposed to highly transmit the two pulse laser beams having passed through the second CLBO crystal 19 and having a wavelength of 1554 nm approximately and a wavelength of 220.9 nm approximately, and highly reflect the fourth pulse laser beam 71C having a wavelength of 193.4 nm approximately and subjected to wavelength conversion through the second CLBO crystal 19.

The high reflectance mirror 83 is disposed so that the fourth pulse laser beam 71C having a wavelength of 193.4 nm approximately is output from the wavelength conversion system 15.

The high reflectance mirror 91 and the high reflectance mirror 92 are disposed so that the fourth pulse laser beam 71C having a wavelength of 193.4 nm approximately is incident on the amplifier 2.

As illustrated in FIG. 2, the amplifier 2 includes an amplifier control unit 30, a charger 31, a trigger corrector 32, a pulse power module (PPM) 34 including a switch 33, a chamber 35, a partially reflective mirror 36, and an output coupling mirror 37.

The chamber 35 is provided with windows 39a and 39b. The chamber 35 is filled with laser gas containing, for example, Ar gas, $F_2$ gas, and Ne gas. The chamber 35 houses a pair of discharging electrodes 38. The pair of discharging electrodes 38 are connected with an output terminal of the PPM 34.

In the amplifier 2, an optical resonator is constituted by the partially reflective mirror 36 and the output coupling mirror 37. The partially reflective mirror 36 includes, for example, a substrate that is made of a $CaF_2$ crystal configured to transmit light having a wavelength of 193.4 nm approximately and is coated with a partial reflection film having a reflectance of 70% to 90% inclusive. The output coupling mirror 37 includes, for example, a substrate that is made of a $CaF_2$ crystal configured to transmit light having a wavelength of 193.4 nm approximately and is coated with a partial reflection film having a reflectance of 10% to 20% inclusive.

Although FIG. 2 illustrates an exemplary configuration in which the optical resonator of the amplifier 2 is a Fabry-Perot resonator, the present invention is not limited to this exemplary configuration. The amplifier 2 may be a ring resonator.

The solid-state laser control unit 14 is connected with each of the first semiconductor laser 20, the second semiconductor laser 40, and the CW excitation semiconductor laser (not illustrated) through a signal line (not illustrated).

The synchronization control unit 7 is supplied, from the exposure apparatus control unit 5 of the exposure apparatus 4 through the laser control unit 3, with an oscillation trigger signal Tr0 instructing the timing of pulse laser beam generation in the solid-state laser system 1.

The synchronization control unit 7 generates a trigger signal Tr1 based on the oscillation trigger signal Tr0, and outputs the trigger signal Tr1 to the synchronization circuit 13. The synchronization control unit 7 also generates a trigger signal Tr2 based on the oscillation trigger signal Tr0, and outputs the trigger signal Tr2 to the trigger corrector 32 through the amplifier control unit 30.

The solid-state laser control unit 14 outputs delay data Tr10 indicating first and second delay times Td1 and Td2 to be described later to the synchronization circuit 13.

The synchronization circuit 13 generates and outputs a first trigger signal Tr11 to the first semiconductor optical amplifier 23 and a second trigger signal Tr12 to the second semiconductor optical amplifier 41 based on the delay data Tr10 from the solid-state laser control unit 14 and the trigger signal Tr1 from the synchronization control unit 7.

[1.1.2 Operation]

The laser control unit 3 causes the first semiconductor laser 20, the second semiconductor laser 40, and an excitation semiconductor laser (not illustrated) to perform CW oscillation through the solid-state laser control unit 14.

When having received the oscillation trigger signal Tr0 from the exposure apparatus control unit 5 of the exposure apparatus 4 through the laser control unit 3, the synchronization control unit 7 controls a delay time between the trigger signal Tr1 and the trigger signal Tr2 so that the pair of discharging electrodes 38 discharge in synchronization with injection into the optical resonator of the amplifier 2 of the fourth pulse laser beam 71C having a wavelength of 193.4 nm approximately and output from the solid-state laser system 1.

In the first solid-state laser device 11, CW oscillation light or pulse oscillation light having a wavelength of 1030 nm approximately is output from the first semiconductor laser 20. The CW oscillation light or pulse oscillation light is converted and amplified to a predetermined pulse width by the first semiconductor optical amplifier 23 and incident on the Yb fiber amplifier system 24 as a pulsed seed beam. The pulsed seed beam is amplified by the Yb fiber amplifier system 24 and the Yb:YAG crystal amplifier 25. Fourth harmonic light having a wavelength of 257.5 nm approximately is generated from this amplified pulse laser beam through the LBO crystal 21 and the CLBO crystal 22. Accordingly, the first pulse laser beam 71A having a wavelength of 257.5 nm approximately is output from the first solid-state laser device 11.

In the second solid-state laser device 12, CW oscillation light or pulse oscillation light having a wavelength of 1554 nm approximately is output from the second semiconductor laser 40. The CW oscillation light or pulse oscillation light is converted and amplified to a predetermined pulse width by the second semiconductor optical amplifier 41 and incident on the Er fiber amplifier system 42. This amplified pulse laser beam is further amplified by the Er fiber amplifier system 42 and output from the second solid-state laser device 12 as the second pulse laser beam 71B having a wavelength of 1554 nm approximately.

The first pulse laser beam 71A having a wavelength of 257.5 nm approximately and output from the first solid-state laser device 11 and the second pulse laser beam 71B having a wavelength of 1554 nm approximately and output from the second solid-state laser device 12 are incident on the wavelength conversion system 15 through the high reflectance mirror 16 and the dichroic mirror 17.

The delay data Tr10 is sent from the solid-state laser control unit 14 to the synchronization circuit 13. The delay data Tr10 includes delay data indicating the first and second delay times Td1 and Td2 set so that the first pulse laser beam 71A and the second pulse laser beam 71B are incident on the first CLBO crystal 18 at timings substantially identical to each other.

The synchronization circuit 13 sends, based on the trigger signal Tr1, the first trigger signal Tr11 to the first semiconductor optical amplifier 23 at a predetermined timing. The synchronization circuit 13 also sends, based on the trigger signal Tr1, the second trigger signal Tr12 to the second semiconductor optical amplifier 41 at a predetermined timing. As a result, the first pulse laser beam 71A and the second pulse laser beam 71B are incident on the first CLBO crystal 18 at timings substantially identical to each other, and the first pulse laser beam 71A and the second pulse laser beam 71B are superimposed on each other on the first CLBO crystal 18. Accordingly, the third pulse laser beam having a wavelength of 220.9 nm approximately as the sum frequency of the wavelength of 257.5 nm approximately and the wavelength of 1554 nm approximately is generated at the first CLBO crystal 18.

The dichroic mirror 81 highly reflects the first pulse laser beam 71A having a wavelength of 257.5 nm approximately and highly transmits the pulse laser beams having a wavelength of 1554 nm approximately and a wavelength of 220.9 nm approximately. Accordingly, the pulse laser beams having a wavelength of 1554 nm approximately and a wavelength of 220.9 nm approximately are incident on the second CLBO crystal 19.

The fourth pulse laser beam 71C having a wavelength of 193.4 nm approximately as the sum frequency of the wavelength of 220.9 nm approximately and the wavelength of 1554 nm approximately is generated at the second CLBO crystal 19.

The dichroic mirror 82 highly transmits the third pulse laser beam having a wavelength of 220.9 nm approximately and the second pulse laser beam 71B having a wavelength of 1554 nm approximately, and highly reflects the fourth pulse laser beam 71C having a wavelength of 193.4 nm approximately.

The fourth pulse laser beam 71C having a wavelength of 193.4 nm approximately is output from the wavelength conversion system 15 through the high reflectance mirror 83.

The fourth pulse laser beam 71C is highly reflected by the high reflectance mirror 91 and injected as a seed beam into the optical resonator of the amplifier 2 including the output coupling mirror 37 and the partially reflective mirror 36 through the high reflectance mirror 92. In synchronization with the injection, population inversion is caused in the chamber 35 of the amplifier 2 through discharging by the pair of discharging electrodes 38. The trigger corrector 32 adjusts the timing of the switch 33 of the PPM 34 so that the fourth pulse laser beam 71C from the solid-state laser system 1, which has a wavelength of 193.4 nm approximately, is efficiently amplified by the amplifier 2. As a result, oscillation of the fourth pulse laser beam 71C is amplified by the optical resonator of the amplifier 2, and the amplified pulse laser beam is output from the output coupling mirror 37. The amplified pulse laser beam is incident on the exposure apparatus 4.

1.2 Details of Wavelength Conversion System

[1.2.1 Configuration]

Figure 3:
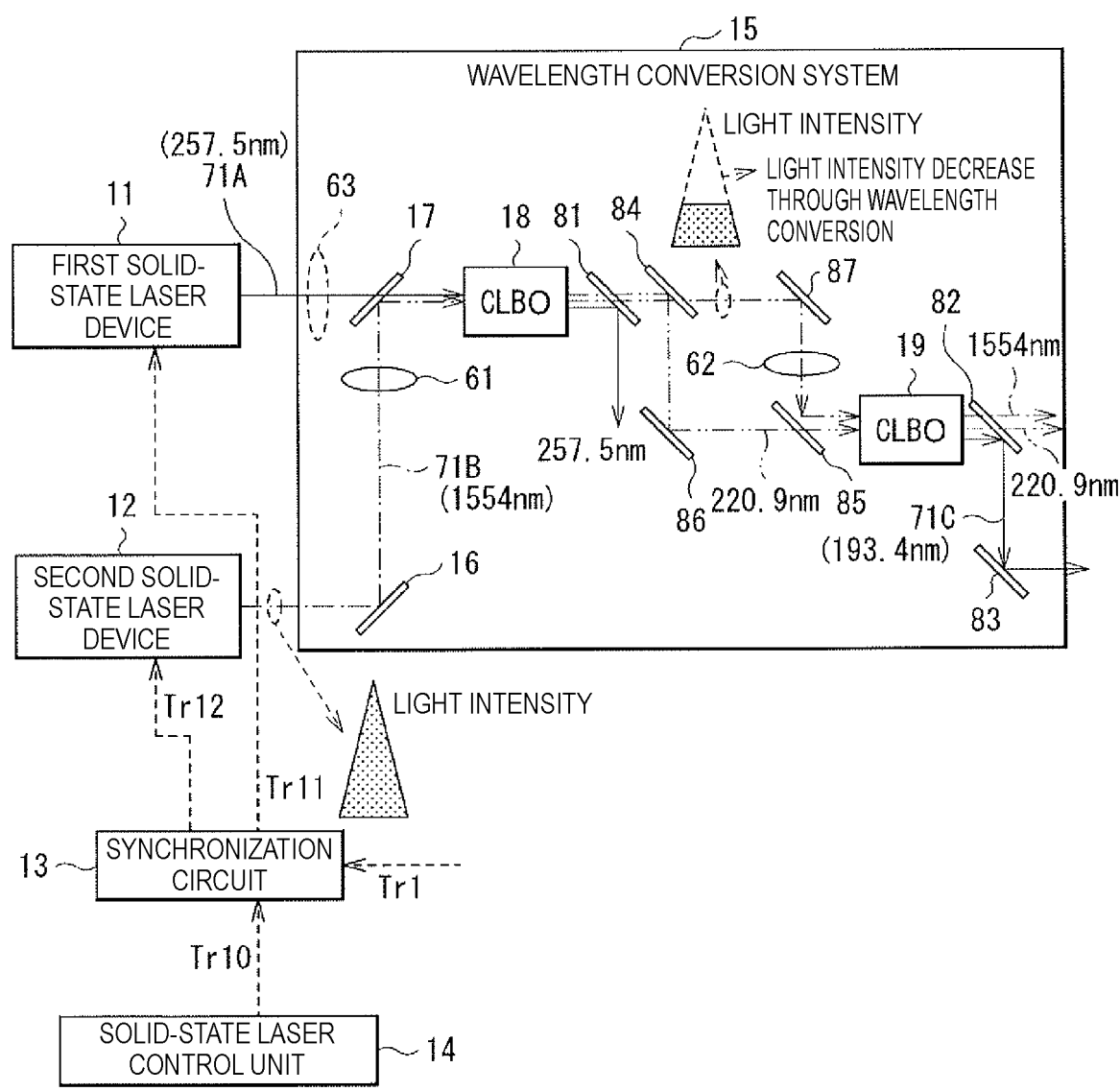
FIG. 3 schematically illustrates a more detailed exemplary configuration of a wavelength conversion system in the solid-state laser system according to the comparative example.

FIG. 3 schematically illustrates a more detailed exemplary configuration of the wavelength conversion system 15 in the solid-state laser system 1 according to the comparative example.

The wavelength conversion system 15 may include condenser lenses 61, 62, and 63, high reflectance mirrors 16, 83, 86, and 87, dichroic mirrors 17, 81, 82, 84, and 85, the first CLBO crystal 18, and the second CLBO crystal 19.

The condenser lens 61 is disposed between the second solid-state laser device 12 and the dichroic mirror 17 on the optical path of the second pulse laser beam 71B having a wavelength of 1554 nm approximately. The condenser lens 61 is disposed so that the second pulse laser beam 71B is focused onto the first CLBO crystal 18 in a superimposed manner on the first pulse laser beam 71A having a wavelength of 257.5 nm approximately and output from the first solid-state laser device 11 via the dichroic mirror 17.

The condenser lens 62 is disposed between the dichroic mirror 84 and the dichroic mirror 85 on the optical path of the second pulse laser beam 71B having a wavelength of 1554 nm approximately. The condenser lens 62 is disposed so that the second pulse laser beam 71B is focused in a superimposed manner on the third pulse laser beam having a wavelength of 220.9 nm approximately via the dichroic mirror 85.

The condenser lens 63 is disposed between the first solid-state laser device 11 and the dichroic mirror 17 on the optical path of the first pulse laser beam 71A having a wavelength of 257.5 nm approximately. The condenser lens 63 is disposed so that the first pulse laser beam 71A is focused onto the first CLBO crystal 18 in a superimposed manner on the second pulse laser beam 71B having a wavelength of 1554 nm approximately and output from the second solid-state laser device 12 via the dichroic mirror 17. The condenser lens 63 may be omitted from the configuration when the spread of the first pulse laser beam 71A having a wavelength of 257.5 nm approximately is small.

The high reflectance mirror 86 is disposed on the optical path of the third pulse laser beam having a wavelength of 220.9 nm approximately and reflected by the dichroic mirror 84. The high reflectance mirror 86 is disposed so that the third pulse laser beam having a wavelength of 220.9 nm approximately is incident on the second CLBO crystal 19 via the dichroic mirror 85. The high reflectance mirror 86 is coated with a film that highly reflects light having a wavelength of 220.9 nm approximately.

The high reflectance mirror 87 is disposed on the optical path of the second pulse laser beam 71B having a wavelength of 1554 nm approximately and having passed through the dichroic mirror 84. The high reflectance mirror 87 is disposed so that the second pulse laser beam 71B is incident on the second CLBO crystal 19 via the dichroic mirror 85. The high reflectance mirror 87 is coated with a film that highly reflects light having a wavelength of 1554 nm approximately.

The dichroic mirror 84 is disposed on the optical path of the third pulse laser beam having a wavelength of 220.9 nm approximately and the optical path of the second pulse laser beam 71B having a wavelength of 1554 nm approximately, both having passed through the dichroic mirror 81. The dichroic mirror 84 is coated with a film that highly reflects light having a wavelength of 220.9 nm approximately and highly transmits light having a wavelength of 1554 nm approximately.

The dichroic mirror 85 is disposed on the optical path of the second pulse laser beam 71B having a wavelength of 1554 nm approximately and having passed through the condenser lens 62. The dichroic mirror 85 is coated with a film that highly transmits light having a wavelength of 220.9 nm approximately and highly reflects light having a wavelength of 1554 nm approximately.

[1.2.2 Operation]

Figure 4:
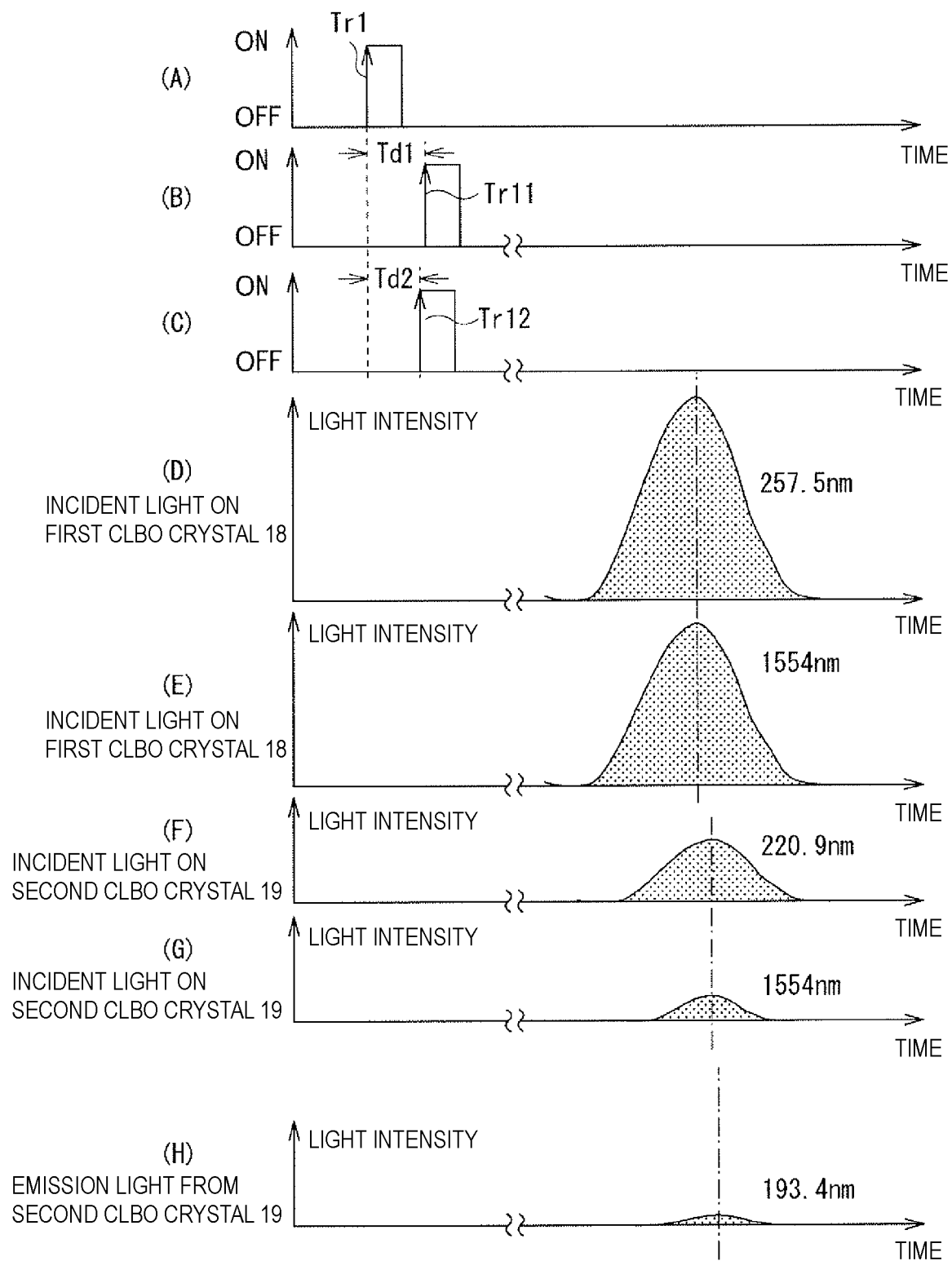
FIG. 4 schematically illustrates exemplary timing charts related to various trigger signals and various pulse laser beams in the solid-state laser system according to the comparative example.

FIG. 4 schematically illustrates exemplary timing charts related to various trigger signals and various pulse laser beams in the solid-state laser system 1 according to the comparative example. In FIG. 4, (A) illustrates the timing of the trigger signal Tr1 to the synchronization circuit 13. (B) illustrates the timing of the first trigger signal Tr11 to the first semiconductor optical amplifier 23. (C) illustrates the timing of the second trigger signal Tr12 to the second semiconductor optical amplifier 41. (D) and (E) each illustrate the incidence timing of light incident on the first CLBO crystal 18. In particular, (D) illustrates the incidence timing of the first pulse laser beam 71A having a wavelength of 257.5 nm approximately on the first CLBO crystal 18. (E) illustrates the incidence timing of the second pulse laser beam 71B having a wavelength of 1554 nm approximately on the first CLBO crystal 18. (F) and (G) each illustrate the incidence timing of light incident on the second CLBO crystal 19. In particular, (F) illustrates the incidence timing of the third pulse laser beam having a wavelength of 220.9 nm approximately on the second CLBO crystal 19. (G) illustrates the incidence timing of the second pulse laser beam 71B having a wavelength of 1554 nm approximately on the second CLBO crystal 19. (H) illustrates the emission timing of the fourth pulse laser beam 71C having a wavelength of 193.4 nm approximately as light emitted from the second CLBO crystal 19. In each of (A) to (H) of FIG. 4, the horizontal axis represents time. In each of (A) to (C), the vertical axis represents the on-off state of a trigger signal. In each of (D) to (H), the vertical axis represents light intensity. The timing of the pulse laser beam in each of (D) to (H) is indicated by using, as a reference, a timing at which the light intensity of the pulse laser beam reaches a peak.

When the trigger signal Tr1 is input on the synchronization circuit 13, the first trigger signal Tr11 is output in the first delay time Td1, set by the solid-state laser control unit 14, to the trigger signal Tr1 as illustrated in (A) and (B) of FIG. 4. In addition, the second trigger signal Tr12 is output in the second delay time Td2, set by the solid-state laser control unit 14, to the trigger signal Tr1 as illustrated in (A) and (C) of FIG. 4.

As illustrated in (D) and (E) of FIG. 4, the first pulse laser beam 71A having a wavelength of 257.5 nm approximately and the second pulse laser beam 71B having a wavelength of 1554 nm approximately are incident on the first CLBO crystal 18 at timings identical to each other, and superimposed on each other on the first CLBO crystal 18.

In the first CLBO crystal 18, the first pulse laser beam 71A having a wavelength of 257.5 nm approximately and the second pulse laser beam 71B having a wavelength of 1554 nm approximately are subjected to wavelength conversion into the third pulse laser beam having a wavelength of 220.9 nm approximately through a sum frequency generation process.

The dichroic mirror 82 highly reflects the first pulse laser beam 71A having a wavelength of 257.5 nm approximately, and highly transmits the third pulse laser beam having a wavelength of 220.9 nm approximately and the second pulse laser beam 71B having a wavelength of 1554 nm approximately.

Subsequently, the dichroic mirror 84 highly reflects the third pulse laser beam having a wavelength of 220.9 nm approximately, and highly transmits the second pulse laser beam 71B having a wavelength of 1554 nm approximately.

The third pulse laser beam having a wavelength of 220.9 nm approximately is incident on the second CLBO crystal 19 through the high reflectance mirror 86 and the dichroic mirror 85.

The second pulse laser beam 71B having a wavelength of 1554 nm approximately is incident on the second CLBO crystal 19 through the high reflectance mirror 87, the condenser lens 62, and the dichroic mirror 85.

As illustrated in (F) and (G) of FIG. 4, the third pulse laser beam having a wavelength of 220.9 nm approximately and the second pulse laser beam 71B having a wavelength of 1554 nm approximately are incident on the second CLBO crystal 19 at timings identical to each other, and superimposed on each other on the second CLBO crystal 19.

As illustrated in (H) of FIG. 4, in the second CLBO crystal 19, the third pulse laser beam having a wavelength of 220.9 nm approximately and the second pulse laser beam 71B having a wavelength of 1554 nm approximately are subjected to wavelength conversion into the fourth pulse laser beam 71C having a wavelength of 193.4 nm approximately through a sum frequency generation process.

[1.2.3 Modification]

Figure 5:
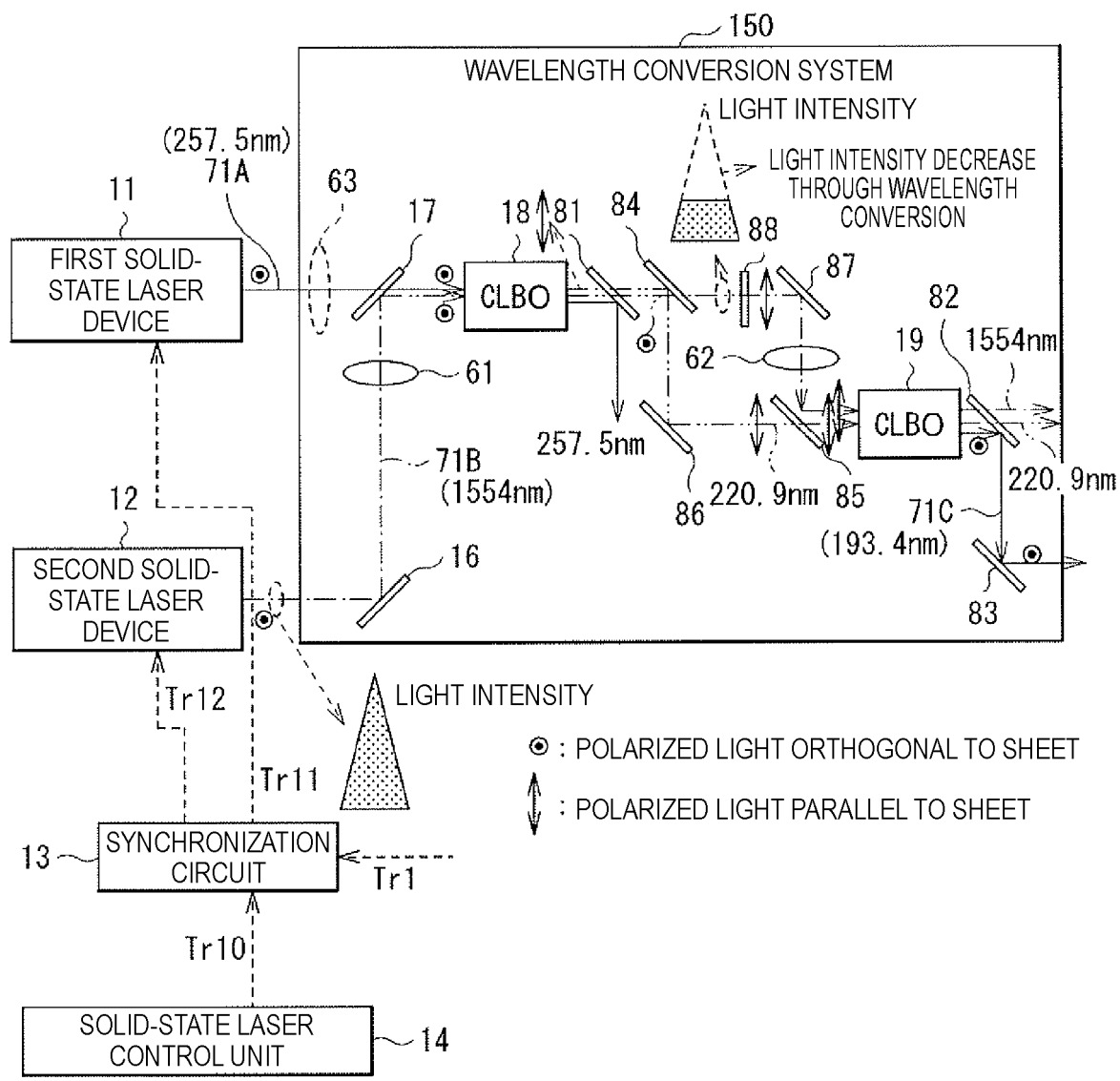
FIG. 5 schematically illustrates a modification of the wavelength conversion system in the solid-state laser system according to the comparative example.

FIG. 5 schematically illustrates a modification of the wavelength conversion system 15 in the solid-state laser system 1 according to the comparative example.

The wavelength conversion system 15 may be configured as a wavelength conversion system 150 illustrated in FIG. 5 with the polarization direction of each pulse laser beam taken into consideration.

The wavelength conversion system 150 further includes a ½ wave plate 88 in addition to the wavelength conversion system 15 in FIG. 3. The ½ wave plate 88 is disposed, for example, between the dichroic mirror 84 and the high reflectance mirror 87 on the optical path of the second pulse laser beam 71B having a wavelength of 1554 nm approximately.

In the wavelength conversion system 150, the first solid-state laser device 11 and the second solid-state laser device 12 emit pulse laser beams having polarization directions identical to each other.

In the wavelength conversion system 150, the first CLBO crystal 18 and the second CLBO crystal 19 are disposed so that the optical axes thereof are orthogonal to each other.

For example, the first pulse laser beam 71A and the second pulse laser beam 71B are incident on the first CLBO crystal 18 with the polarization directions thereof being orthogonal to the sheet.

The first CLBO crystal 18 outputs the third pulse laser beam having a wavelength of 220.9 nm approximately as light polarized parallel to the sheet.

The second pulse laser beam 71B not subjected to the wavelength conversion in the first CLBO crystal 18 passes through the dichroic mirror 81 and the dichroic mirror 84, and the polarization direction thereof is rotated by 90° through the ½ wave plate 88 and becomes parallel to the sheet.

The second pulse laser beam 71B having a polarization direction parallel to the sheet and the third pulse laser beam having a polarization direction parallel to the sheet are incident on the second CLBO crystal 19. The fourth pulse laser beam 71C having a wavelength of 193.4 nm approximately and having a polarization direction orthogonal to the sheet is output from the second CLBO crystal 19 through a sum frequency generation process.

1.3 Problem

The first solid-state laser device 11 configured to output the first pulse laser beam 71A having a wavelength of 257.5 nm approximately includes the Yb fiber amplifier system 24, the Yb:YAG crystal amplifier 25 as a solid-state amplifier, and the LBO crystal 21 and the CLBO crystal 22 configured to convert a pulse laser beam having a wavelength of 1030 nm approximately into fourth harmonic light.

In an exposure-apparatus laser apparatus, the spectrum line width of a laser beam needs to be narrowed so that chromatic aberration becomes negligible. To achieve such a narrowed spectrum line width, the spectrum line width of each pulse laser beam output from the first solid-state laser device 11 and the second solid-state laser device 12 of the solid-state laser system 1 needs to be narrowed. However, when a pulse laser beam having a narrowed spectrum line width is amplified by an optical fiber amplifier, stimulated Brillouin scattering (SBS) occurs and the amplification is suppressed in some cases. In the Yb fiber amplifier system 24, it is difficult to set high pulse energy for suppressing stimulated Brillouin scattering. However, in the first solid-state laser device 11, it is possible to increase the pulse energy of a pulse laser beam having a wavelength of 1030 nm approximately as fundamental wave by using a solid-state amplifier that does not cause stimulated Brillouin scattering. As a result, it is also possible to increase output of the first pulse laser beam 71A having a wavelength of 257.5 nm approximately and converted into fourth harmonic light.

However, no appropriate solid-state amplifier exists for a wavelength band at the wavelength of 1554 nm approximately, and thus, in the second solid-state laser device 12, the second pulse laser beam 71B having a wavelength of 1554 nm approximately needs to be amplified while stimulated Brillouin scattering is suppressed by the Er fiber amplifier system 42. Thus, in the second solid-state laser device 12, it is difficult to increase the pulse energy of the second pulse laser beam 71B having a wavelength of 1554 nm approximately.

Thus, to increase the pulse energy of the fourth pulse laser beam 71C having a wavelength of 193.4 nm approximately, the pulse energy of the first pulse laser beam 71A having a wavelength of 257.5 nm approximately as fourth harmonic having a wavelength of 1030 nm approximately needs to be increased.

However, the increase of the pulse energy of the first pulse laser beam 71A having a wavelength of 257.5 nm approximately leads to increase of the consumption amount of the pulse energy of the second pulse laser beam 71B having a wavelength of 1554 nm approximately in a sum frequency generation process at the first CLBO crystal 18 of the wavelength conversion system 15. This decreases the pulse energy of the second pulse laser beam 71B having a wavelength of 1554 nm approximately and not consumed in the first CLBO crystal 18. Thus, the light intensity of the second pulse laser beam 71B incident on the second CLBO crystal 19 decreases. In the second CLBO crystal 19, the decreased second pulse laser beam 71B having a wavelength of 1554 nm approximately is used to generate the fourth pulse laser beam 71C having a wavelength of 193.4 nm approximately.

Thus, it is difficult to sufficiently improve the efficiency of wavelength conversion in the wavelength conversion system 15 by increasing the pulse energy of the first pulse laser beam 71A having a wavelength of 257.5 nm approximately and output from the first solid-state laser device 11.

1.4 Summary of Embodiments

To solve the above-described difficulties, in embodiments described below, the second pulse laser beam 71B is caused to be incident on the second CLBO crystal 19 at a first timing before the second pulse laser beam 71B is incident on the first CLBO crystal 18. Residual light of the second pulse laser beam 71B, which has not been used in a sum frequency generation process, in other words, has not been consumed in wavelength conversion and has passed through the second CLBO crystal 19 is caused to be incident on the first CLBO crystal 18 at a second timing later than the first timing. In this manner, the second pulse laser beam 71B is caused to be incident on the second CLBO crystal 19 first, and subsequently, the residual light of the second pulse laser beam 71B, which has not been consumed in wavelength conversion and has passed through the second CLBO crystal 19 is caused to be incident on the first CLBO crystal 18. Accordingly, the fourth pulse laser beam 71C is generated while decrease of the light intensity of the second pulse laser beam 71B incident on the second CLBO crystal 19 is reduced.

In the embodiments described below, similarly to the comparative example, the first wavelength of the first pulse laser beam 71A is 257.5 nm approximately, but the present invention is not limited thereto. The first wavelength may be another value in the range of 220 nm to 400 nm inclusive. In the following description, the second wavelength of the second pulse laser beam 71B is 1554 nm approximately, but the present invention is not limited thereto. The second wavelength may be another value in the range of 1100 nm to 2000 nm inclusive. In the following description, the fourth wavelength of the fourth pulse laser beam 71C is 193.4 nm approximately, but the present invention is not limited thereto. The fourth wavelength may be another value in the range of 150 nm to 300 nm inclusive.

<2. Embodiment 1> (First Exemplary Solid-State Laser System)

The following describes a solid-state laser system according to Embodiment 1 of the present disclosure. In the following description, any component substantially identical to that of the solid-state laser system 1 according to the comparative example is denoted by an identical reference sign, and description thereof will be omitted as appropriate.

2.1 Configuration

Figure 6:
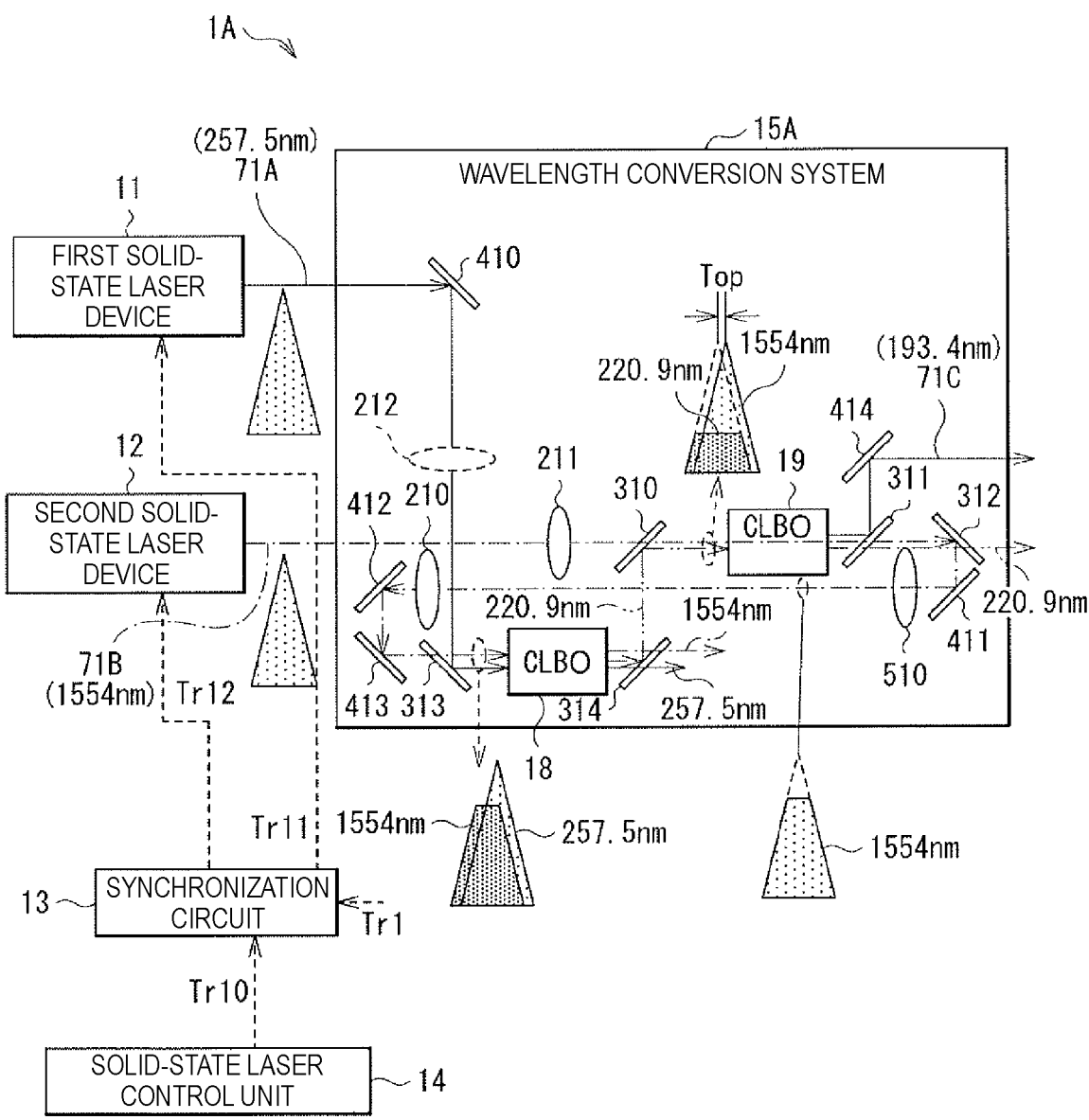
FIG. 6 schematically illustrates an exemplary configuration of a solid-state laser system according to Embodiment 1.

FIG. 6 schematically illustrates an exemplary configuration of a solid-state laser system 1A according to Embodiment 1.

The solid-state laser system 1A includes a wavelength conversion system 15A in place of the wavelength conversion system 15 in the solid-state laser system 1 according to the comparative example.

The solid-state laser system 1A is configured so that the first timing at which the second pulse laser beam 71B is incident on the second CLBO crystal 19 substantially coincides with the timing at which the first pulse laser beam 71A is incident on the first CLBO crystal 18.

The wavelength conversion system 15A includes the first CLBO crystal 18, the second CLBO crystal 19, condenser lenses 210, 211, and 212, high reflectance mirrors 410, 411, 412, 413, and 414, dichroic mirrors 310, 311, 312, 313, and 314, and a collimator lens 510.

The condenser lens 210 is disposed between the collimator lens 510 and the dichroic mirror 313 on the optical path of the second pulse laser beam 71B having a wavelength of 1554 nm approximately. In the example illustrated in FIG. 6, the condenser lens 210 is disposed on the optical path between the collimator lens 510 and the high reflectance mirror 412.

The condenser lens 211 is disposed between the second solid-state laser device 12 and the dichroic mirror 310 on the optical path of the second pulse laser beam 71B having a wavelength of 1554 nm approximately.

The condenser lens 212 is disposed between the first solid-state laser device 11 and the dichroic mirror 313 on the optical path of the first pulse laser beam 71A having a wavelength of 257.5 nm approximately. In the example illustrated in FIG. 6, the condenser lens 212 is disposed on the optical path between the high reflectance mirror 410 and the dichroic mirror 313. When the spread of the first pulse laser beam 71A having a wavelength of 257.5 nm approximately is small, the condenser lens 212 may be omitted from the configuration.

The collimator lens 510 is disposed between the dichroic mirror 312 and the condenser lens 210 on the optical path of the second pulse laser beam 71B having a wavelength of 1554 nm approximately. The collimator lens 510 is disposed to collimate the second pulse laser beam 71B having a wavelength of 1554 nm approximately and output from the second CLBO crystal 19.

The dichroic mirror 310 is disposed between the condenser lens 211 and the second CLBO crystal 19 on the optical path of the second pulse laser beam 71B having a wavelength of 1554 nm approximately and on the optical path of the third pulse laser beam having a wavelength of 220.9 nm approximately and highly reflected by the dichroic mirror 313. The dichroic mirror 310 is coated with a film that highly reflects light having a wavelength of 220.9 nm approximately and highly transmits light having a wavelength of 1554 nm approximately. The dichroic mirror 310 is disposed so that the condensed second pulse laser beam 71B having a wavelength of 1554 nm approximately in the second CLBO crystal 19 and a pulse laser beam having a wavelength of 220.7 nm approximately are superimposed on each other.

The dichroic mirror 311 is disposed on the optical paths of the pulse laser beams output from the second CLBO crystal 19 and having a wavelength of 193.4 nm approximately, a wavelength of 220.9 nm approximately, and a wavelength of 1554 nm approximately so that reflected light is incident on the high reflectance mirror 414. The dichroic mirror 311 is coated with a film that highly reflects light having a wavelength of 193.4 nm approximately and highly transmits light having a wavelength of 220.9 nm approximately and a wavelength of 1554 nm approximately.

The dichroic mirror 312 is disposed on the optical paths of the pulse laser beams having a wavelength of 220.9 nm approximately and a wavelength of 1554 nm approximately and having passed through the dichroic mirror 311 so that reflected light is incident on the high reflectance mirror 411. The dichroic mirror 312 is coated with a film that highly transmits light having a wavelength of 220.9 nm approximately and highly reflects light having a wavelength of 1554 nm approximately.

The dichroic mirror 313 is disposed between the high reflectance mirror 411 and the first CLBO crystal 18 on the optical path of the second pulse laser beam 71B having a wavelength of 1554 nm approximately. The dichroic mirror 313 is disposed so that the second pulse laser beam 71B having a wavelength of 1554 nm approximately and reflected by the high reflectance mirror 412 and the high reflectance mirror 413 is incident on the dichroic mirror 313. The dichroic mirror 313 is coated with a film that highly transmits light having a wavelength of 220.9 nm approximately and highly reflects light having a wavelength of 1554 nm approximately. The dichroic mirror 313 is disposed so that the condensed second pulse laser beam 71B having a wavelength of 1554 nm approximately and the condensed first pulse laser beam 71A having a wavelength of 257.5 nm approximately are superimposed on each other in the first CLBO crystal 18.

The dichroic mirror 314 is disposed on the optical paths of the first pulse laser beam 71A having a wavelength of 257.5 nm approximately, the third pulse laser beam having a wavelength of 220.9 nm approximately, and the second pulse laser beam 71B having a wavelength of 1554 nm approximately, all output from the first CLBO crystal 18, so that reflected light is incident on the dichroic mirror 310. The dichroic mirror 314 is coated with a film that highly reflects light having a wavelength of 220.7 nm approximately and highly transmits light having a wavelength of 257.5 nm approximately and a wavelength of 1554 nm approximately.

The high reflectance mirrors 411, 412, and 413 are disposed on the optical path of the second pulse laser beam 71B having a wavelength of 1554 nm approximately and reflected by the dichroic mirror 312. The high reflectance mirrors 411, 412, and 413 are disposed so that the second pulse laser beam 71B having a wavelength of 1554 nm approximately is incident on the first CLBO crystal 18 via the dichroic mirror 313. The high reflectance mirrors 411, 412, and 143 are each coated with a film that highly reflects light having a wavelength of 1554 nm approximately.

The other configuration may be substantially same as that of the solid-state laser system 1 according to the comparative example.

2.2 Operation

In the solid-state laser system 1A, the second pulse laser beam 71B having a wavelength of 1554 nm approximately is caused to be incident on the second CLBO crystal 19 first. Subsequently, the second pulse laser beam 71B having a wavelength of 1554 nm approximately and not consumed in wavelength conversion in the second CLBO crystal 19 is caused to be incident on the first CLBO crystal 18. Subsequently, the third pulse laser beam having a wavelength of 220.9 nm approximately and subjected to wavelength conversion in the first CLBO crystal 18 is caused to be incident on the second CLBO crystal 19 and provided with a sum frequency with the second pulse laser beam 71B having a wavelength of 1554 nm approximately and caused to be incident earlier, thereby outputting the fourth pulse laser beam 71C having a wavelength of 193.4 nm approximately.

The delay data Tr10 indicating the first and second delay times Td1 and Td2 is set to the synchronization circuit 13 so that the timing at which the first pulse laser beam 71A having a wavelength of 257.5 nm approximately is incident on the first CLBO crystal 18 coincides with the timing at which the second pulse laser beam 71B having a wavelength of 1554 nm approximately is incident on the second CLBO crystal 19.

L1 represents the length of the optical path of the second pulse laser beam 71B having a wavelength of 1554 nm approximately from the second CLBO crystal 19 to the first CLBO crystal 18. L2 represents the length of the optical path of the third pulse laser beam having a wavelength of 220.9 nm approximately from the first CLBO crystal 18 to the second CLBO crystal 19.

A length L of the optical path from the second CLBO crystal 19 to the second CLBO crystal 19 through the first CLBO crystal 18 is expressed by an equation below:

$$L=L1+L2$$

A time Top of light traveling through the optical path length L is expressed by an equation below:

$$Top=L/c=T1+T2=L1/c+L2/c$$

In the equation, c represents the speed of light, and T1 and T2 represent times in which light travels through the optical path L1 and the optical path L2, respectively. For example, the optical path length L is preferably equal to or shorter than 0.9 m. When the optical path length L is 0.9 m, Top is 3 ns. Td represents the timing difference between the incidence timing of the second pulse laser beam 71B having a wavelength of 1554 nm approximately on the second CLBO crystal 19 and the incidence timing of the first pulse laser beam 71A having a wavelength of 257.5 nm approximately on the first CLBO crystal 18.

The first delay time Td1 and the second delay time Td2 are set so that the incidence timing of the first pulse laser beam 71A having a wavelength of 257.5 nm approximately on the first CLBO crystal 18 substantially coincides with the incidence timing of the second pulse laser beam 71B having a wavelength of 1554 nm approximately on the second CLBO crystal 19. In this case, Td=0 second.

Figure 7:
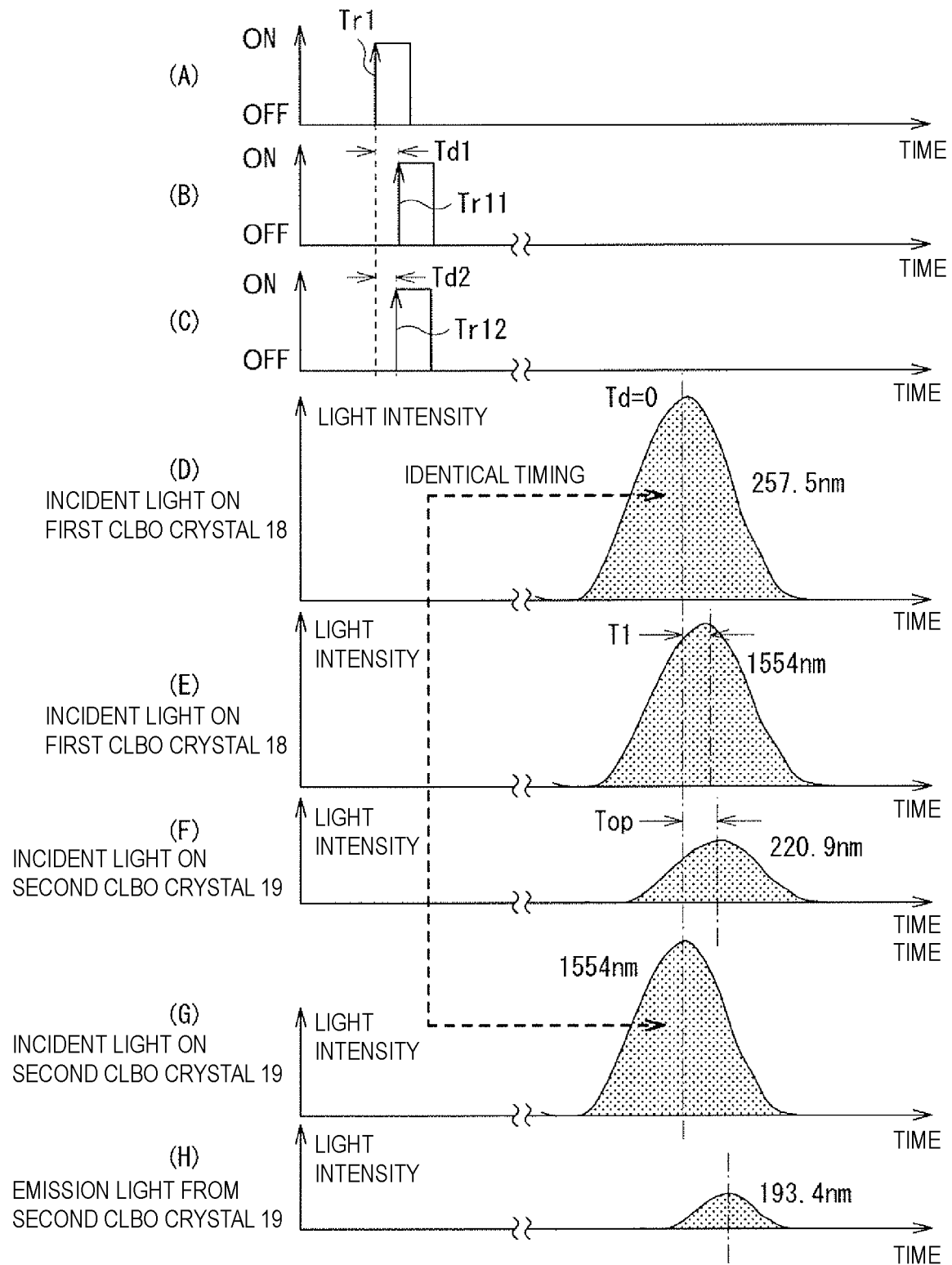
FIG. 7 schematically illustrates exemplary timing charts related to various trigger signals and various pulse laser beams in the solid-state laser system according to Embodiment 1.

FIG. 7 schematically illustrates exemplary timing charts related to various trigger signals and various pulse laser beams in the solid-state laser system 1A according to Embodiment 1. The meanings of timing charts of (A) to (H) of FIG. 7 are same as those of (A) to (H) of FIG. 4.

FIG. 7 is a timing chart when the incidence timing of the first pulse laser beam 71A having a wavelength of 257.5 nm approximately on the first CLBO crystal 18 substantially coincides with the incidence timing of the second pulse laser beam 71B having a wavelength of 1554 nm approximately on the second CLBO crystal 19, in other words, in the case of Td=0.

When the trigger signal Tr1 is input on the synchronization circuit 13, the first trigger signal Tr11 is output in the first delay time Td1, set by the solid-state laser control unit 14, to the trigger signal Tr1 as illustrated in (A) and (B) of FIG. 7. In addition, the second trigger signal Tr12 is output in the second delay time Td2, set by the solid-state laser control unit 14, to the trigger signal Tr1 as illustrated in (A) and (C) of FIG. 7.

As illustrated in (D) and (G) of FIG. 7, the incidence timing of the first pulse laser beam 71A having a wavelength of 257.5 nm approximately on the first CLBO crystal 18 substantially coincides with the incidence timing of the second pulse laser beam 71B having a wavelength of 1554 nm approximately on the second CLBO crystal 19.

As illustrated in (D) and (E) of FIG. 7, in the first CLBO crystal 18, the second pulse laser beam 71B having a wavelength of 1554 nm approximately is incident behind the first pulse laser beam 71A having a wavelength of 257.5 nm approximately by $T1=L1/c$. In the first CLBO crystal 18, the first pulse laser beam 71A having a wavelength of 257.5 nm approximately and the second pulse laser beam 71B having a wavelength of 1554 nm approximately are subjected to wavelength conversion into the third pulse laser beam having a wavelength of 220.9 nm approximately through a sum frequency generation process.

As illustrated in (F) and (G) of FIG. 7, in the second CLBO crystal 19, the third pulse laser beam having a wavelength of 220.9 nm approximately is incident behind the second pulse laser beam 71B having a wavelength of 1554 nm approximately by $Top=L/c$.

As illustrated in (H) of FIG. 7, in the second CLBO crystal 19, the third pulse laser beam having a wavelength of 220.9 nm approximately and the second pulse laser beam 71B having a wavelength of 1554 nm approximately are subjected to wavelength conversion into the fourth pulse laser beam 71C having a wavelength of 193.4 nm approximately through a sum frequency generation process.

For example, D represents the pulse width of each of a pulse laser beam output from the first solid-state laser device 11 and a pulse laser beam output from the second solid-state laser device 12. In the solid-state laser system 1A, the wavelength conversion efficiency can decrease by a ratio $Er=Top/D$ of the delay Top of the third pulse laser beam from the second pulse laser beam 71B in the second CLBO crystal 19 relative to the pulse width D.

Assume a case in which the pulse width D of each of the first pulse laser beam 71A output from the first solid-state laser device 11 and the second pulse laser beam 71B output from the second solid-state laser device 12 is 6 ns approximately and Top is 3 ns. In this case, Er is $\frac{3}{6}*100=50\%$, and the decrease of the wavelength conversion efficiency due to the timing difference between the second pulse laser beam 71B and the third pulse laser beam is reduced. The value of Er is preferably 50% or lower.

The other operation may be substantially same as that of the solid-state laser system 1 according to the comparative example.

2.3 Effect

According to the solid-state laser system 1A according to Embodiment 1, the use efficiency of the second pulse laser beam 71B can be largely improved by first causing the second pulse laser beam 71B having a wavelength of 1554 nm approximately to be incident on the second CLBO crystal 19 and subsequently causing residual light of the second pulse laser beam 71B not consumed in wavelength conversion in the second CLBO crystal 19 to be incident on the first CLBO crystal 18.

In addition, the ratio $Er=Top/D$ of the delay Top of the third pulse laser beam from the second pulse laser beam 71B in the second CLBO crystal 19 relative to the pulse width D of each of the first and second pulse laser beams 71A and 71B can be reduced. Accordingly, decrease of the wavelength conversion efficiency due to the incidence timing difference between the second pulse laser beam 71B and the third pulse laser beam in the second CLBO crystal 19 can be reduced.

In this manner, the wavelength conversion efficiency of the wavelength conversion system 15A can be improved.

<3. Embodiment 2> (Second Exemplary Solid-State Laser System)

The following describes a solid-state laser system according to Embodiment 2 of the present disclosure. In the following description, any component substantially identical to that of the solid-state laser system according to the comparative example or Embodiment 1 is denoted by an identical reference sign, and description thereof will be omitted as appropriate.

3.1 Configuration

Figure 8:
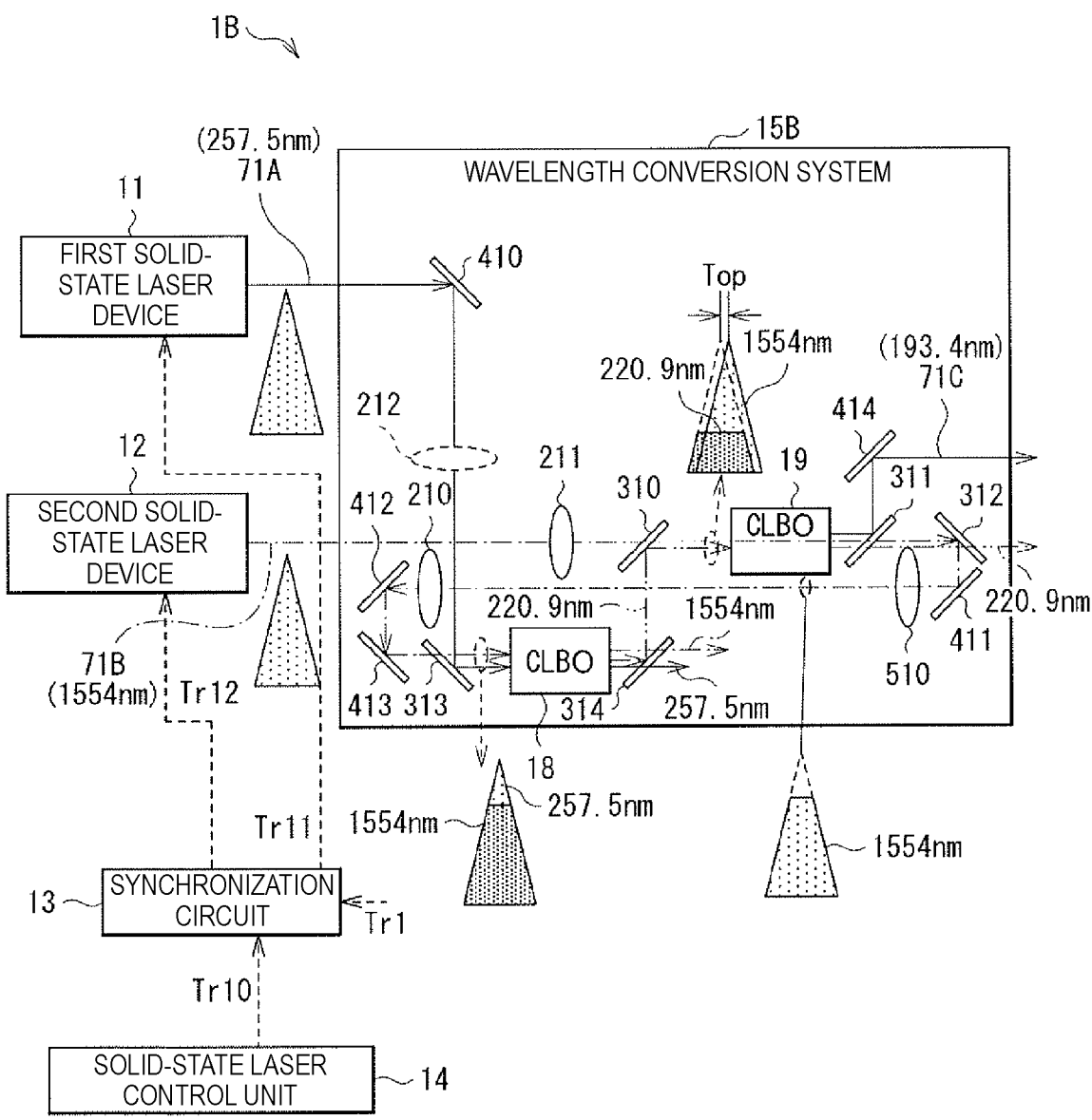
FIG. 8 schematically illustrates an exemplary configuration of a solid-state laser system according to Embodiment 2.

FIG. 8 schematically illustrates an exemplary configuration of a solid-state laser system 1B according to Embodiment 2.

The solid-state laser system 1B includes a wavelength conversion system 15B in place of the wavelength conversion system 15 in the solid-state laser system 1 according to the comparative example.

The solid-state laser system 1B is configured so that the second timing at which residual light of the second pulse laser beam 71B having passed through the second CLBO crystal 19 is incident on the first CLBO crystal 18 substantially coincides with the timing at which the first pulse laser beam 71A is incident on the first CLBO crystal 18.

The configuration of the solid-state laser system 1B may be substantially same as that of the solid-state laser system 1A according to Embodiment 1 except for a configuration related to the emission timing of the first pulse laser beam 71A from the first solid-state laser device 11 and the emission timing of the second pulse laser beam 71B from the second solid-state laser device 12.

3.2 Operation and Effect

In the solid-state laser system 1B, the first and second delay times Td1 and Td2 are set in advance so that the incidence timing of the first pulse laser beam 71A on the first CLBO crystal 18 substantially coincides with the incidence timing of the second pulse laser beam 71B on the first CLBO crystal 18.

Figure 9:
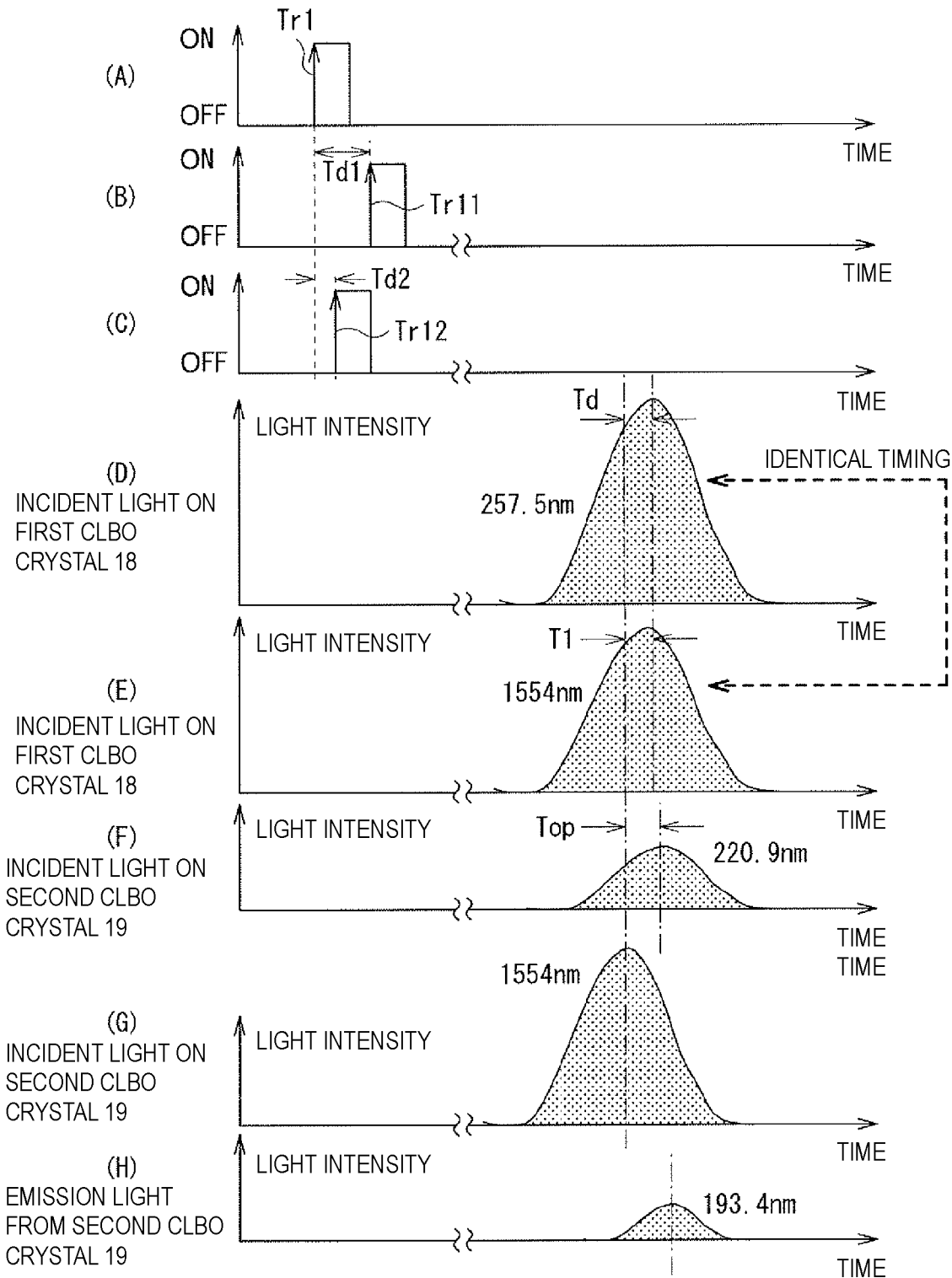
FIG. 9 schematically illustrates exemplary timing charts related to various trigger signals and various pulse laser beams in the solid-state laser system according to Embodiment 2.

FIG. 9 schematically illustrates exemplary timing charts related to various trigger signals and various pulse laser beams in the solid-state laser system 1B according to Embodiment 2. The meanings of timing charts of (A) to (H) of FIG. 9 are same as those of (A) to (H) of FIG. 4.

FIG. 9 is a timing chart when the incidence timing of the first pulse laser beam 71A having a wavelength of 257.5 nm approximately on the first CLBO crystal 18 substantially coincides with the incidence timing of the second pulse laser beam 71B having a wavelength of 1554 nm approximately on the first CLBO crystal 18, in other words, in the case of Td=T1.

When the trigger signal Tr1 is input on the synchronization circuit 13, the first trigger signal Tr11 is output in the first delay time Td1, set by the solid-state laser control unit 14, to the trigger signal Tr1 as illustrated in (A) and (B) of FIG. 9. In addition, the second trigger signal Tr12 is output in the second delay time Td2, set by the solid-state laser control unit 14, to the trigger signal Tr1 as illustrated in (A) and (C) of FIG. 9.

As illustrated in (D) and (E) of FIG. 9, the first pulse laser beam 71A having a wavelength of 257.5 nm approximately and the second pulse laser beam 71B having a wavelength of 1554 nm approximately are incident on the first CLBO crystal 18 at timings substantially identical to each other.

As illustrated in (F) of FIG. 9, in the first CLBO crystal 18, the second pulse laser beam 71B having a wavelength of 1554 nm approximately and the first pulse laser beam 71A having a wavelength of 257.5 nm approximately are superimposed on each other and subjected to wavelength conversion into the third pulse laser beam having a wavelength of 220.9 nm approximately through a sum frequency generation process.

As illustrated in (F) and (G) of FIG. 9, in the second CLBO crystal 19, the third pulse laser beam having a wavelength of 220.9 nm approximately is incident behind the second pulse laser beam 71B having a wavelength of 1554 nm approximately by Top=L/c.

As illustrated in (H) of FIG. 9, in the second CLBO crystal 19, the third pulse laser beam having a wavelength of 220.9 nm approximately and the second pulse laser beam 71B having a wavelength of 1554 nm approximately are subjected to wavelength conversion into the fourth pulse laser beam 71C having a wavelength of 193.4 nm approximately through a sum frequency generation process.

For example, D represents the pulse width of each of the pulse laser beam output from the first solid-state laser device 11 and the pulse laser beam output from the second solid-state laser device 12. In the solid-state laser system 1B, the wavelength conversion efficiency can decrease by the ratio Er=Top/D of the delay Top of the third pulse laser beam from the second pulse laser beam 71B in the second CLBO crystal 19 relative to the pulse width D.

Assume a case in which the pulse width D of each of the first pulse laser beam 71A output from the first solid-state laser device 11 and the second pulse laser beam 71B output from the second solid-state laser device 12 is 6 ns approximately and Top is 3 ns. In this case, Er is 3/6*100=50%, and the decrease of the wavelength conversion efficiency due to the timing difference between the second pulse laser beam 71B and the third pulse laser beam is reduced. The value of Er is preferably 50% or lower.

The other operation and effect may be substantially same as those of the solid-state laser system 1A according to Embodiment 1.

<4. Embodiment 3> (Wavelength Conversion System Including Ring Optical Path)

The following describes a solid-state laser system according to Embodiment 3 of the present disclosure. In the following description, any component substantially identical to that of the solid-state laser system according to the comparative example or Embodiment 1 or 2 is denoted by an identical reference sign, and description thereof will be omitted as appropriate.

4.1 Configuration

Figure 10:
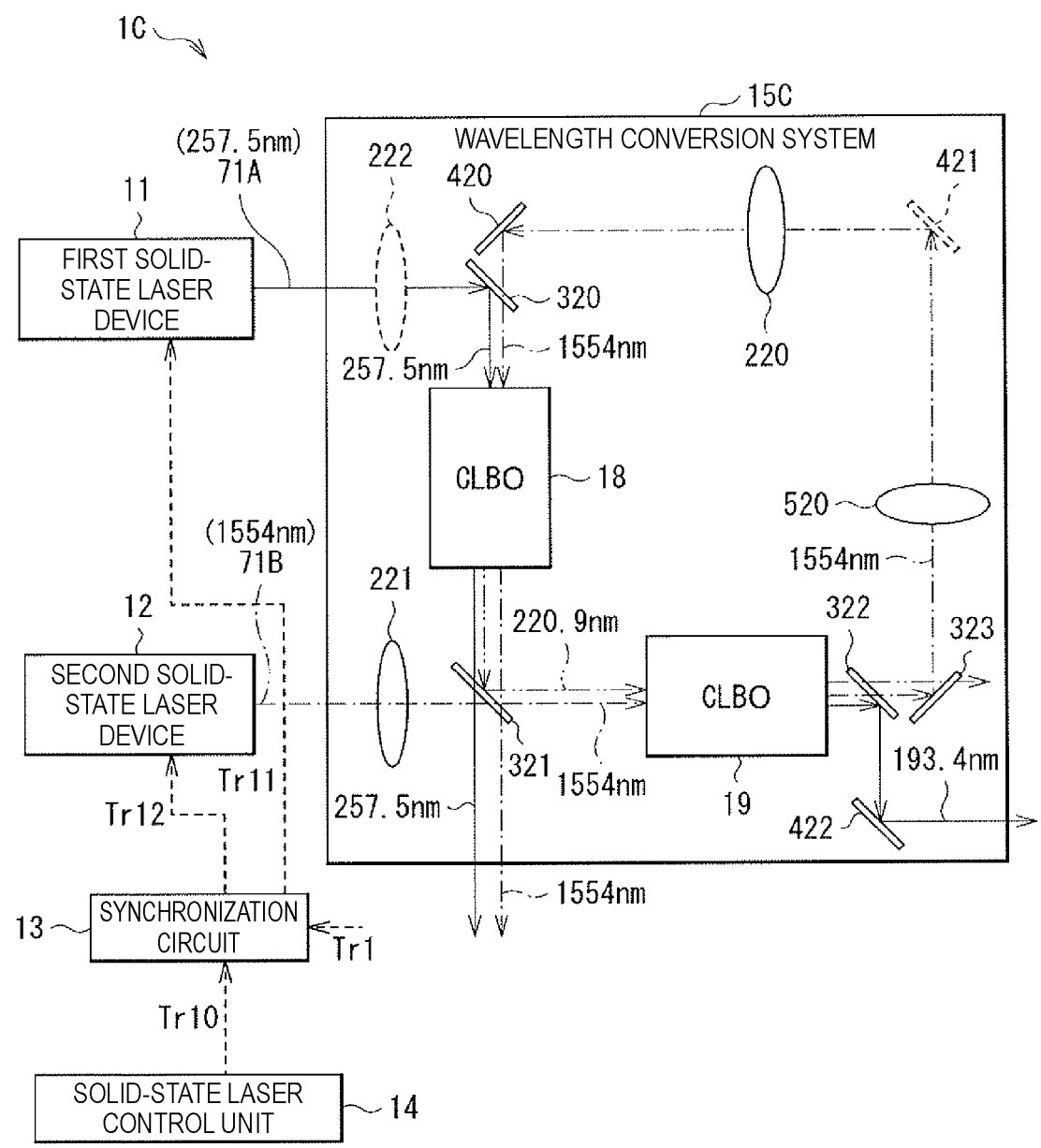
FIG. 10 schematically illustrates an exemplary configuration of a solid-state laser system according to Embodiment 3.

FIG. 10 schematically illustrates an exemplary configuration of a solid-state laser system 1C according to Embodiment 3.

The solid-state laser system 1C includes a wavelength conversion system 15C in place of the wavelength conversion system 15 in the solid-state laser system 1 according to the comparative example.

The wavelength conversion system 15C includes a first dichroic mirror disposed at a position at which the optical path of the second pulse laser beam 71B and the optical path of the third pulse laser beam intersect between the second solid-state laser device 12 and the second CLBO crystal 19. The first dichroic mirror transmits the second pulse laser beam 71B toward the second CLBO crystal 19, and reflects the third pulse laser beam toward the second CLBO crystal 19. The first dichroic mirror may be a dichroic mirror 321 to be described later.

The wavelength conversion system 15C also includes a second dichroic mirror disposed on the optical path of residual light of the second pulse laser beam 71B and configured to reflect the residual light of the second pulse laser beam 71B. The second dichroic mirror may be a dichroic mirror 323 to be described later.

The wavelength conversion system 15C also includes a reflection mirror disposed on the optical path of residual light of the second pulse laser beam 71B after being reflected by the second dichroic mirror and configured to reflect the residual light of the second pulse laser beam 71B. The reflection mirror may be a high reflectance mirror 420 to be described later.

The wavelength conversion system 15C also includes a third dichroic mirror disposed at a position at which the optical path of residual light of the second pulse laser beam 71B after being reflected by the reflection mirror and the optical path of the first pulse laser beam 71A intersect and configured to reflect the first pulse laser beam 71A toward the first CLBO crystal 18 and transmit the residual light of the second pulse laser beam 71B toward the first CLBO crystal 18. The third dichroic mirror may be a dichroic mirror 320 to be described later.

The wavelength conversion system 15C includes condenser lenses 220, 221, and 222, the high reflectance mirror 420, high reflectance mirrors 421 and 422, the dichroic mirrors 320, 321, and 323, a dichroic mirror 322, the first CLBO crystal 18, the second CLBO crystal 19, and a collimator lens 520.

In the wavelength conversion system 15C, a ring optical path is formed by the dichroic mirrors 320, 321, 322, and 323 and the high reflectance mirrors 420 and 421.

The first CLBO crystal 18 is disposed on the optical path between the dichroic mirror 320 and the dichroic mirror 321.

The second CLBO crystal 19 is disposed on the optical path between the dichroic mirror 321 and the dichroic mirror 322.

The collimator lens 520 is disposed on the optical path between the dichroic mirror 323 and the high reflectance mirror 421 to collimate the second pulse laser beam 71B having a wavelength of 1554 nm approximately and not consumed in the second CLBO crystal 19.

The condenser lens 220 is disposed on the optical path between the high reflectance mirror 421 and the high reflectance mirror 420 to focus, onto the first CLBO crystal 18, the second pulse laser beam 71B having a wavelength of 1554 nm approximately and collimated through the collimator lens 520.

The dichroic mirror 321 is coated with a film that highly transmits light having a wavelength of 1554 nm approximately and a wavelength of 257.5 nm and highly reflects light having a wavelength of 220.9 nm approximately.

The dichroic mirror 322 is disposed on the optical path between the second CLBO crystal 19 and the dichroic mirror 323. The dichroic mirror 322 is coated with a film that highly transmits light having a wavelength of 1554 nm approximately and a wavelength of 220.9 nm approximately and highly reflects light having a wavelength of 193.4 nm approximately.

The dichroic mirror 323 is disposed on the optical path of the second pulse laser beam 71B having a wavelength of 1554 nm approximately and the optical path of the third pulse laser beam having a wavelength of 220.9 nm approximately. The dichroic mirror 323 is coated with a film that highly transmits light having a wavelength of 220.9 nm approximately and highly reflects light having a wavelength of 1554 nm approximately.

The high reflectance mirror 420 is disposed on the optical path between the high reflectance mirror 421 and the dichroic mirror 320 to reflect, toward the dichroic mirror 320, the second pulse laser beam 71B having a wavelength of 1554 nm approximately and reflected by the high reflectance mirror 421.

The dichroic mirror 320 highly reflects the first pulse laser beam 71A having a wavelength of 257.5 nm approximately and output from the first solid-state laser device 11. The dichroic mirror 320 is disposed to highly transmit the second pulse laser beam 71B having a wavelength of 1554 nm approximately and reflected by the high reflectance mirror 420 so that the first pulse laser beam 71A having a wavelength of 257.5 nm approximately and the second pulse laser beam 71B having a wavelength of 1554 nm approximately are superimposed on each other in the first CLBO crystal 18. The dichroic mirror 320 is coated with a film that highly reflects light having a wavelength of 257.5 nm approximately and highly transmits light having a wavelength of 1554 nm approximately.

The high reflectance mirror 422 is disposed to output the fourth pulse laser beam 71C having a wavelength of 193.4 nm approximately to the outside. The high reflectance mirror 422 is coated with a film that highly reflects light having a wavelength of 193.4 nm approximately.

The condenser lens 222 is disposed on the optical path between the first solid-state laser device 11 and the dichroic mirror 320. The condenser lens 222 is disposed so that the first pulse laser beam 71A having a wavelength of 257.5 nm approximately and output from the first solid-state laser device 11 is focused onto the first CLBO crystal 18 in a superimposed manner on the condensed second pulse laser beam 71B having a wavelength of 1554 nm approximately via the dichroic mirror 320.

The condenser lens 221 is disposed so that the second pulse laser beam 71B having a wavelength of 1554 nm approximately is focused onto the second CLBO crystal 19 in a superimposed manner on the third pulse laser beam having a wavelength of 220.9 nm approximately via the dichroic mirror 321.

The optical path length L of the optical path from the second CLBO crystal 19 to the second CLBO crystal 19 through the first CLBO crystal 18 in the wavelength conversion system 15C is the optical path length of the ring optical path formed by the dichroic mirrors 320, 321, 322, and 323 and the high reflectance mirrors 420 and 421.

The first and second delay times Td1 and Td2 of the first and second trigger signals Tr11 and Tr12, respectively, from the trigger signal Tr1 in the synchronization circuit 13 may be set to be substantially same as those in Embodiment 1 or Embodiment 2.

Specifically, substantially similarly to the timings of Embodiment 1 illustrated in FIG. 7, the first and second delay times Td1 and Td2 may be set so that the incidence timing of the first pulse laser beam 71A having a wavelength of 257.5 nm approximately on the first CLBO crystal 18 substantially coincides with the incidence timing of the second pulse laser beam 71B having a wavelength of 1554 nm approximately on the second CLBO crystal 19.

Alternatively, substantially similarly to the timings of Embodiment 2 illustrated in FIG. 9, the first and second delay times Td1 and Td2 may be set so that the incidence timing of the first pulse laser beam 71A having a wavelength of 257.5 nm approximately on the first CLBO crystal 18 substantially coincides with the incidence timing of the second pulse laser beam 71B having a wavelength of 1554 nm approximately.

The other configuration may be substantially same as that of the solid-state laser system according to the comparative example or Embodiment 1 or 2.

4.2 Operation

The first pulse laser beam 71A having a wavelength of 257.5 nm approximately and output from the first solid-state laser device 11 is focused by the condenser lens 222 onto the first CLBO crystal 18 via the dichroic mirror 320.

The second pulse laser beam 71B having a wavelength of 1554 nm approximately and not used for wavelength conversion in the second CLBO crystal 19 is condensed by the condenser lens 220 to be superimposed on the first pulse laser beam 71A having a wavelength of 257.5 nm approximately and focused onto the first CLBO crystal 18 via the high reflectance mirror 420 and the dichroic mirror 320. As a result, part of both pulse laser beams is converted into the third pulse laser beam having a wavelength of 220.9 nm approximately through a sum frequency generation process.

The second pulse laser beam 71B having a wavelength of 1554 nm approximately and output from the second solid-state laser device 12 is focused by the condenser lens 221 onto the second CLBO crystal 19 via the dichroic mirror 321.

The third pulse laser beam having a wavelength of 220.9 nm approximately is incident on the second CLBO crystal 19 via the dichroic mirror 321 and superimposed on the second pulse laser beam 71B having a wavelength of 1554 nm approximately. As a result, part of both pulse laser beams is converted into the fourth pulse laser beam 71C having a wavelength of 193.4 nm approximately through a sum frequency generation process.

The second CLBO crystal 19 outputs the fourth pulse laser beam 71C having a wavelength of 193.4 nm approximately, the third pulse laser beam having a wavelength of 220.9 nm approximately and not used for wavelength conversion, and the second pulse laser beam 71B having a wavelength of 1554 nm approximately and not used for wavelength conversion.

The dichroic mirror 322 outputs the fourth pulse laser beam 71C having a wavelength of 193.4 nm approximately through the high reflectance mirror 422.

The third pulse laser beam having a wavelength of 220.9 nm approximately and having passed through the dichroic mirror 322 is highly transmitted through the dichroic mirror 323. The second pulse laser beam 71B having a wavelength of 1554 nm approximately and having passed through the dichroic mirror 322 is highly reflected by the dichroic mirror 323.

The second pulse laser beam 71B having a wavelength of 1554 nm approximately and having been highly reflected by the dichroic mirror 323 is collimated through the collimator lens 520.

The second pulse laser beam 71B having a wavelength of 1554 nm approximately is reflected by the high reflectance mirror 421, and is condensed by the condenser lens 220 to be focused onto the first CLBO crystal 18 in a superimposed manner on the first pulse laser beam 71A having a wavelength of 257.5 nm approximately via the high reflectance mirror 420 and the dichroic mirror 320.

The other operation may be substantially same as that of the solid-state laser system according to the comparative example or Embodiment 1 or 2.

4.3 Effect

According to the solid-state laser system 1C according to Embodiment 3, the first CLBO crystal 18 and the second CLBO crystal 19 are disposed on the ring optical path formed by the dichroic mirrors 320, 321, 322, and 323 and the high reflectance mirrors 420 and 421. Accordingly, the length L of the optical path from the second CLBO crystal 19 to the second CLBO crystal 19 through the first CLBO crystal 18 can be shortened as compared to the optical path configuration in FIG. 6. As a result, the delay Top of the third pulse laser beam having a wavelength of 220.9 nm approximately from the second pulse laser beam 71B having a wavelength of 1554 nm approximately in the second CLBO crystal 19 can be further reduced. Thus, according to the solid-state laser system 1C, the wavelength conversion efficiency is improved as compared to the solid-state laser system 1A in FIG. 6.

The other effect may be substantially same as that of the solid-state laser system according to the comparative example or Embodiment 1 or 2.

(Others)

In the wavelength conversion system 15C, the high reflectance mirror 421 may be omitted from the configuration, and a substantially triangular optical path may be formed by the dichroic mirrors 320, 321, 322, and 323 and the high reflectance mirror 420. Accordingly, the optical path length L can be further shortened.

<5. Embodiment 4> (Method of Optimizing Wavelength Conversion Efficiency)

The following describes a solid-state laser system according to Embodiment 4 of the present disclosure. In the following description, any component substantially identical to that of the solid-state laser system according to the comparative example or Embodiments 1 to 3 is denoted by an identical reference sign, and description thereof will be omitted as appropriate.

5.1 Configuration and Operation

Figure 11:
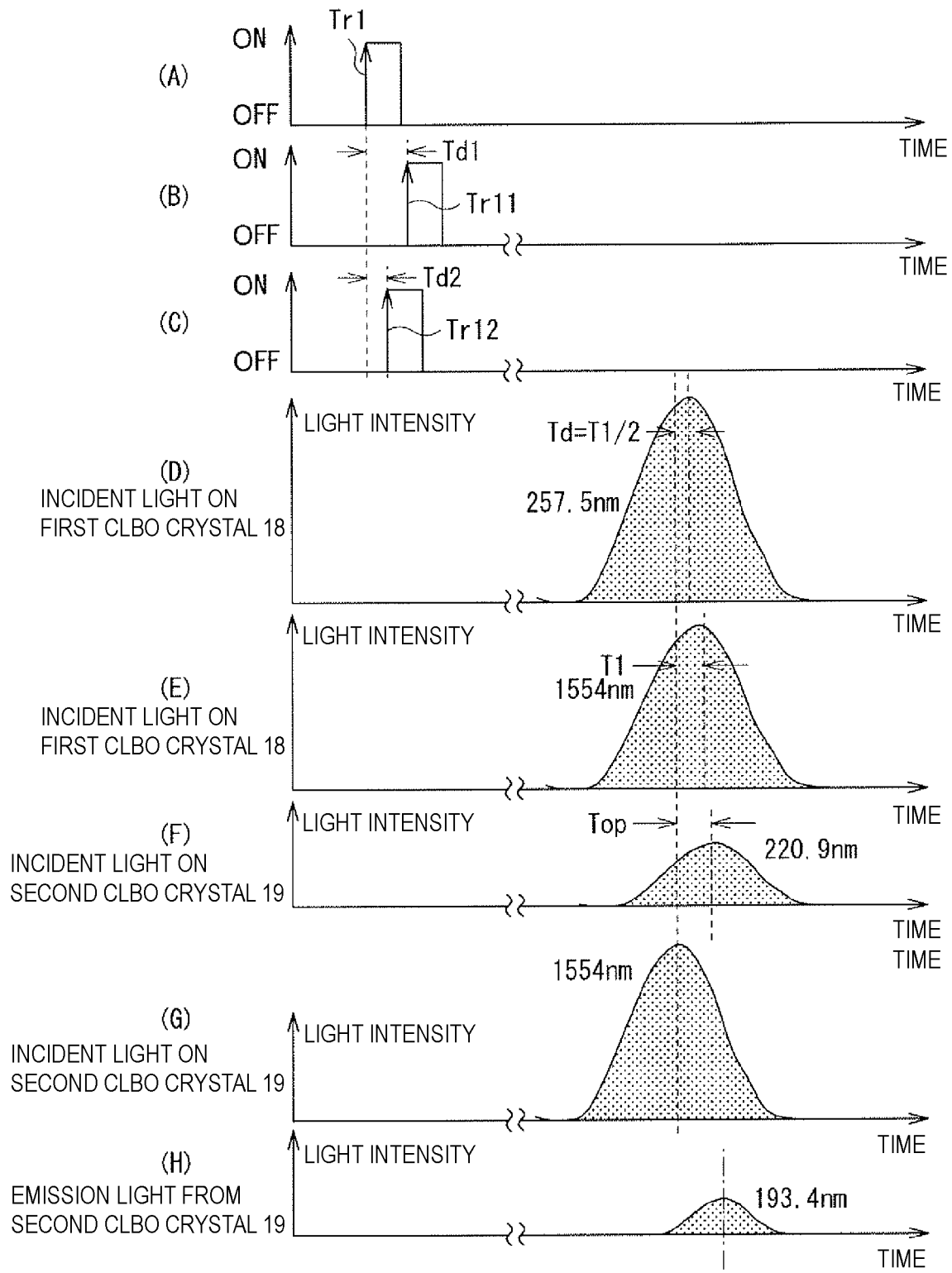
FIG. 11 schematically illustrates exemplary timing charts related to various trigger signals and various pulse laser beams in a solid-state laser system according to Embodiment 4.

FIG. 11 schematically illustrates exemplary timing charts related to various trigger signals and various pulse laser beams in a solid-state laser system according to Embodiment 4. The meanings of timing charts of (A) to (H) of FIG. 11 are same as those of (A) to (H) of FIG. 4.

The configuration of the solid-state laser system according to Embodiment 4 may be substantially same as that of the solid-state laser system 1A according to Embodiment 1 except for a configuration related to the emission timing of the first pulse laser beam 71A from the first solid-state laser device 11 and the emission timing of the second pulse laser beam 71B from the second solid-state laser device 12.

In the solid-state laser system according to Embodiment 4, substantially similarly to the solid-state laser system 1A according to Embodiment 1, the second pulse laser beam 71B is caused to be incident on the second CLBO crystal 19 at the first timing before the second pulse laser beam 71B is incident on the first CLBO crystal 18. Then, residual light of the second pulse laser beam 71B, which has not been used in the sum frequency generation process, in other words, has not been consumed in wavelength conversion and has passed through the second CLBO crystal 19 is caused to be incident on the first CLBO crystal 18 at the second timing later than the first timing.

In the solid-state laser system according to Embodiment 4, the timing at which the first pulse laser beam 71A is incident on the first CLBO crystal 18 is a timing between the first timing and the second timing. Specifically, in the solid-state laser system according to Embodiment 4, the timing at which the first pulse laser beam 71A is incident on the first CLBO crystal 18 is set to be a timing before the second pulse laser beam 71B reaches the first CLBO crystal 18 after having passed through the second CLBO crystal 19. The timing at which the first pulse laser beam 71A is incident on the first CLBO crystal 18 is preferably the middle timing between the first timing and the second timing.

Td represents the difference between the incidence timing of the second pulse laser beam 71B having a wavelength of 1554 nm approximately on the second CLBO crystal 19 and the incidence timing of the first pulse laser beam 71A having a wavelength of 257.5 nm approximately on the first CLBO crystal 18. T1 represents a time in which the second pulse laser beam 71B having a wavelength of 1554 nm approximately travels through the length of the optical path from the second CLBO crystal 19 to the first CLBO crystal 18.

Figure 12:
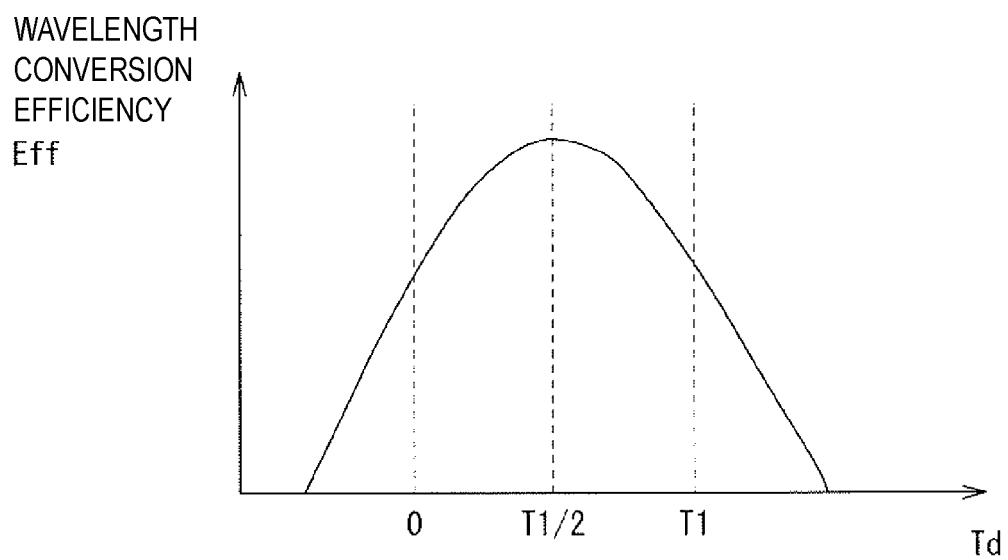
FIG. 12 schematically illustrates exemplary wavelength conversion efficiency of the wavelength conversion system.

FIG. 12 schematically illustrates exemplary wavelength conversion efficiency of a wavelength conversion system in the solid-state laser system according to Embodiment 4. In FIG. 12, the horizontal axis represents Td, and the vertical axis represents the wavelength conversion efficiency Eff of the wavelength conversion system.

As illustrated in FIG. 12, the range of Td is preferably $0 \leq Td \leq T1$ in accordance with the relation between Td and the wavelength conversion efficiency Eff. The value of Td is more preferably T1/2.

In reality, the value of Td at which the conversion efficiency is maximum is slightly shifted from T1/2 in some cases due to the pulse waveforms of the second pulse laser beam 71B having a wavelength of 1554 nm approximately and the first pulse laser beam 71A having a wavelength of 257.5 nm approximately.

To achieve the maximum conversion efficiency, the difference between input timings of the first trigger signal Tr11 to the first solid-state laser device 11 and the second trigger signal Tr12 to the second solid-state laser device 12 may be changed to determine the timing difference between the first trigger signal Tr11 and the second trigger signal Tr12 with which the maximum conversion efficiency is achieved, and the first and second delay times Td1 and Td2 may be set to the synchronization circuit 13.

The other configuration and operation may be substantially same as those of the solid-state laser system according to the comparative example or Embodiments 1 to 3.

5.2 Effect

According to the solid-state laser system according to Embodiment 4, the wavelength conversion efficiency of the wavelength conversion system can be further improved.

The other effect may be substantially same as that of the solid-state laser system according to the comparative example or Embodiments 1 to 3.

<6. Embodiment 5> (First Exemplary Solid-State Laser System with Polarization Direction Taken into Consideration)

The following describes a solid-state laser system according to Embodiment 5 of the present disclosure. In the following description, any component substantially identical to that of the solid-state laser system according to the comparative example or Embodiments 1 to 4 is denoted by an identical reference sign, and description thereof will be omitted as appropriate.

6.1 Configuration

Figure 13:
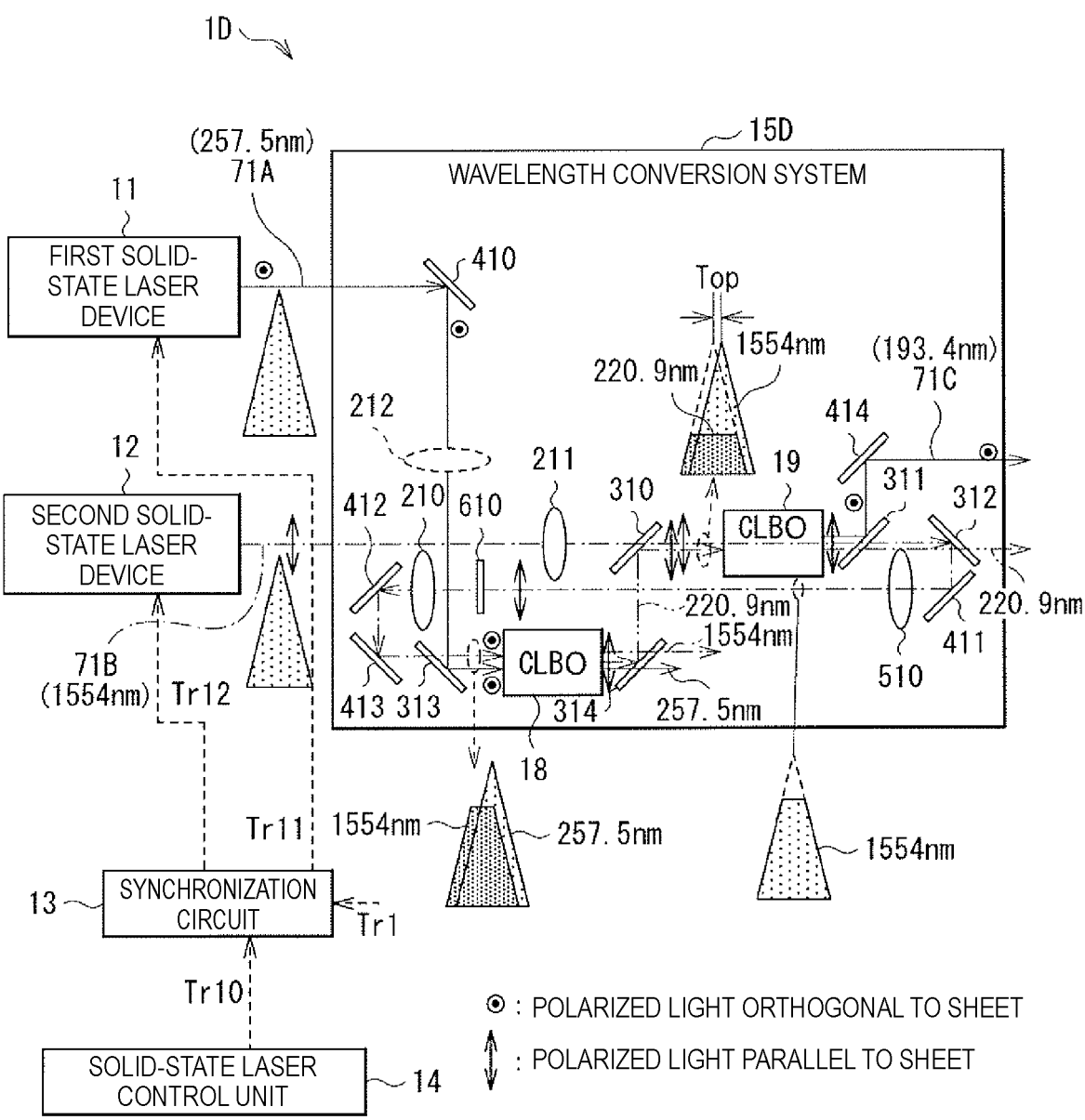
FIG. 13 schematically illustrates an exemplary configuration of a solid-state laser system according to Embodiment 5.

FIG. 13 schematically illustrates an exemplary configuration of a solid-state laser system 1D according to Embodiment 5.

The solid-state laser system 1D includes a wavelength conversion system 15D in place of the wavelength conversion system 15 in the solid-state laser system 1 according to the comparative example.

The wavelength conversion system 15D has the configuration of the wavelength conversion system 15A in FIG. 6 with the polarization direction of each pulse laser beam taken into consideration.

The wavelength conversion system 15D further includes a ½ wave plate 610 in addition to the configuration the wavelength conversion system 15A in FIG. 6. The ½ wave plate 610 is disposed between the first CLBO crystal 18 and the second CLBO crystal 19 on the optical path of residual light of the second pulse laser beam 71B. In the example illustrated in FIG. 13, the ½ wave plate 610 is disposed between the collimator lens 510 and the condenser lens 210 on the optical path of residual light of the second pulse laser beam 71B.

In the solid-state laser system 1D, the first solid-state laser device 11 outputs the first pulse laser beam 71A polarized in a first polarization direction. The second solid-state laser device 12 outputs the second pulse laser beam 71B polarized in a second polarization direction orthogonal to the first polarization direction.

In the wavelength conversion system 15D, the first CLBO crystal 18 and the second CLBO crystal 19 are disposed so that the optical axes thereof are orthogonal to each other.

6.2 Operation and Effect

In the solid-state laser system 1D, the first pulse laser beam 71A and the second pulse laser beam 71B are incident on the wavelength conversion system 15D so that the polarization directions thereof are orthogonal to each other.

For example, the first pulse laser beam 71A is incident on the first CLBO crystal 18 while being polarized in a direction orthogonal to the sheet. The second pulse laser beam 71B is incident on the second CLBO crystal 19 while being polarized in a direction parallel to the sheet. The second pulse laser beam 71B not subjected to wavelength conversion in the second CLBO crystal 19 is converted into parallel light by the collimator lens 510 via the dichroic mirrors 311 and 312 and the high reflectance mirror 411. The polarization direction of the second pulse laser beam 71B is rotated by 90° by the ½ wave plate 610 and becomes orthogonal to the sheet.

The second pulse laser beam 71B and the first pulse laser beam 71A are incident on the first CLBO crystal 18 while being polarized in the direction orthogonal to the sheet, and are converted into the third pulse laser beam polarized in the direction parallel to the sheet through a sum frequency.

The third pulse laser beam and the second pulse laser beam 71B are incident on the second CLBO crystal 19 while being polarized in the direction parallel to the sheet, and the fourth pulse laser beam 71C having a wavelength of 193.4 nm approximately and orthogonal to the sheet is output through a sum frequency generation process.

The other configuration, operation, and effect may be substantially same as those of the solid-state laser system according to the comparative example or Embodiments 1 to 4.

<7. Embodiment 6> (Second Exemplary Solid-State Laser System with Polarization Direction Taken into Consideration)

The following describes a solid-state laser system according to Embodiment 6 of the present disclosure. In the following description, any component substantially identical to that of the solid-state laser system according to the comparative example or Embodiments 1 to 5 is denoted by an identical reference sign, and description thereof will be omitted as appropriate.

7.1 Configuration

Figure 14:
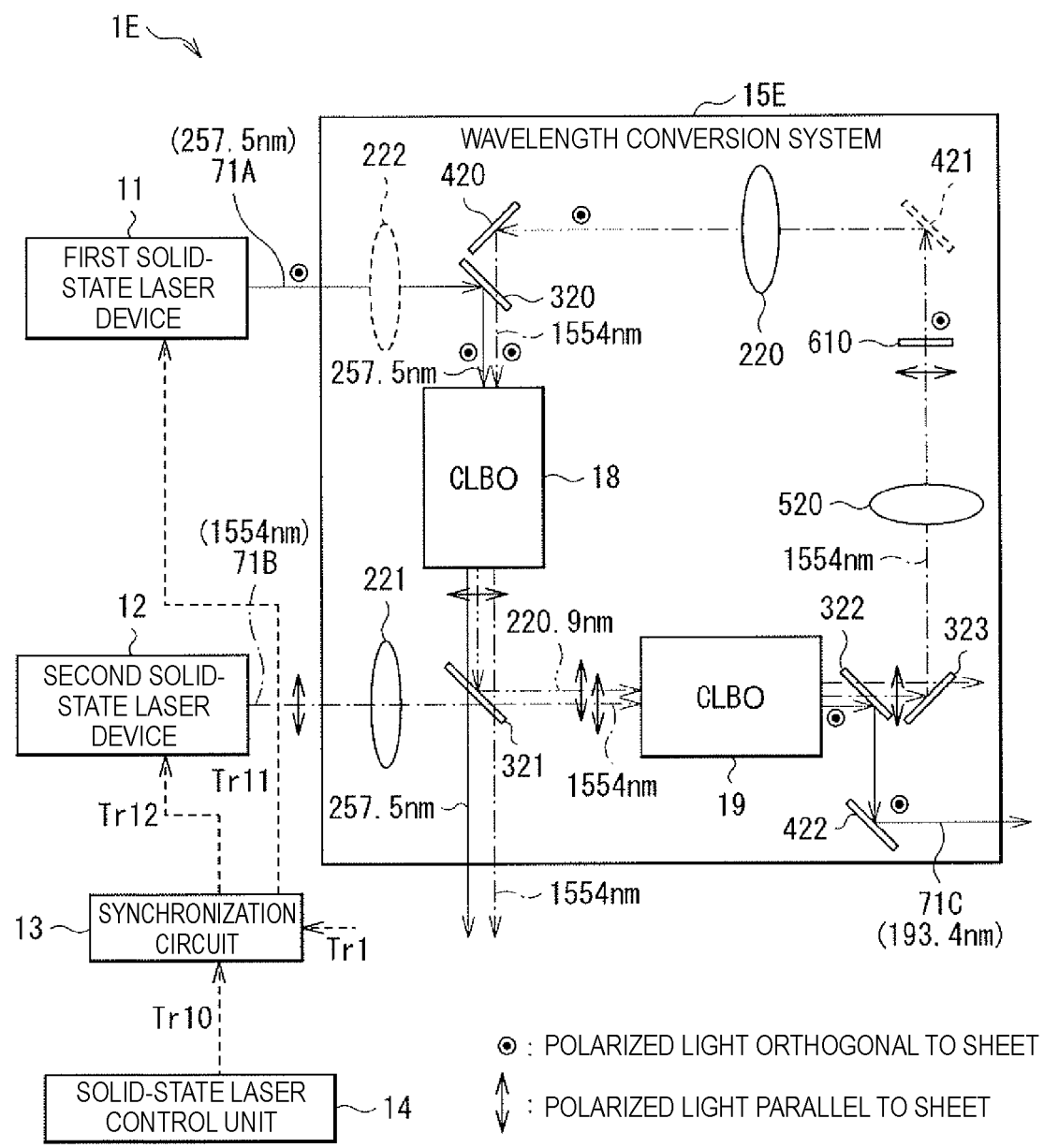
FIG. 14 schematically illustrates an exemplary configuration of a solid-state laser system according to Embodiment 6.

FIG. 14 schematically illustrates an exemplary configuration of a solid-state laser system 1E according to Embodiment 6.

The solid-state laser system 1E includes a wavelength conversion system 15E in place of the wavelength conversion system 15 in the solid-state laser system 1 according to the comparative example.

The wavelength conversion system 15E has the configuration of the wavelength conversion system 15C in FIG. 10 with the polarization direction of each pulse laser beam taken into consideration.

The wavelength conversion system 15E further includes the ½ wave plate 610 in addition to the configuration of the wavelength conversion system 15C in FIG. 10. The ½ wave plate 610 is disposed between the first CLBO crystal 18 and the second CLBO crystal 19 on the optical path of residual light of the second pulse laser beam 71B. In the example illustrated in FIG. 14, the ½ wave plate 610 is disposed between the collimator lens 520 and the condenser lens 220 on the optical path of residual light of the second pulse laser beam 71B.

In the solid-state laser system 1E, the first solid-state laser device 11 outputs the first pulse laser beam 71A polarized in a first polarization direction. The second solid-state laser device 12 outputs the second pulse laser beam 71B polarized in a second polarization direction orthogonal to the first polarization direction.

In the wavelength conversion system 15E, the first CLBO crystal 18 and the second CLBO crystal 19 are disposed so that the optical axes thereof are orthogonal to each other.

7.2 Operation and Effect

In the solid-state laser system 1E, the first pulse laser beam 71A and the second pulse laser beam 71B are incident on the wavelength conversion system 15E so that the polarization directions thereof are orthogonal to each other.

For example, the first pulse laser beam 71A is incident on the first CLBO crystal 18 while being polarized in the direction orthogonal to the sheet. The second pulse laser beam 71B is incident on the second CLBO crystal 19 while being polarized in the direction parallel to the sheet. The second pulse laser beam 71B not subjected to wavelength conversion in the second CLBO crystal 19 is converted into parallel light by the collimator lens 520 via the dichroic mirror 322 and the dichroic mirror 323. The polarization direction of the second pulse laser beam 71B is rotated by 90° by the ½ wave plate 610 and becomes orthogonal to the sheet.

The second pulse laser beam 71B and the first pulse laser beam 71A are incident on the first CLBO crystal 18 while being polarized in the direction orthogonal to the sheet, and are converted into the third pulse laser beam polarized in the direction parallel to the sheet through a sum frequency generation process.

The third pulse laser beam and the second pulse laser beam 71B are incident on the second CLBO crystal 19 while being polarized in the direction parallel to the sheet, and the fourth pulse laser beam 71C having a wavelength of 193.4 nm approximately and polarized in the direction orthogonal to the sheet through a sum frequency generation process, is output.

The other configuration, operation, and effect may be substantially same as those of the solid-state laser system according to the comparative example or Embodiments 1 to 5.

<8. Embodiment 7> (Exemplary Configuration of Semiconductor Laser and Semiconductor Optical Amplifier)

The following describes a solid-state laser system according to Embodiment 6 of the present disclosure. In the following description, any component substantially identical to that of the solid-state laser system according to the comparative example or Embodiments 1 to 5 is denoted by an identical reference sign, and description thereof will be omitted as appropriate.

8.1 Configuration

Figure 15:
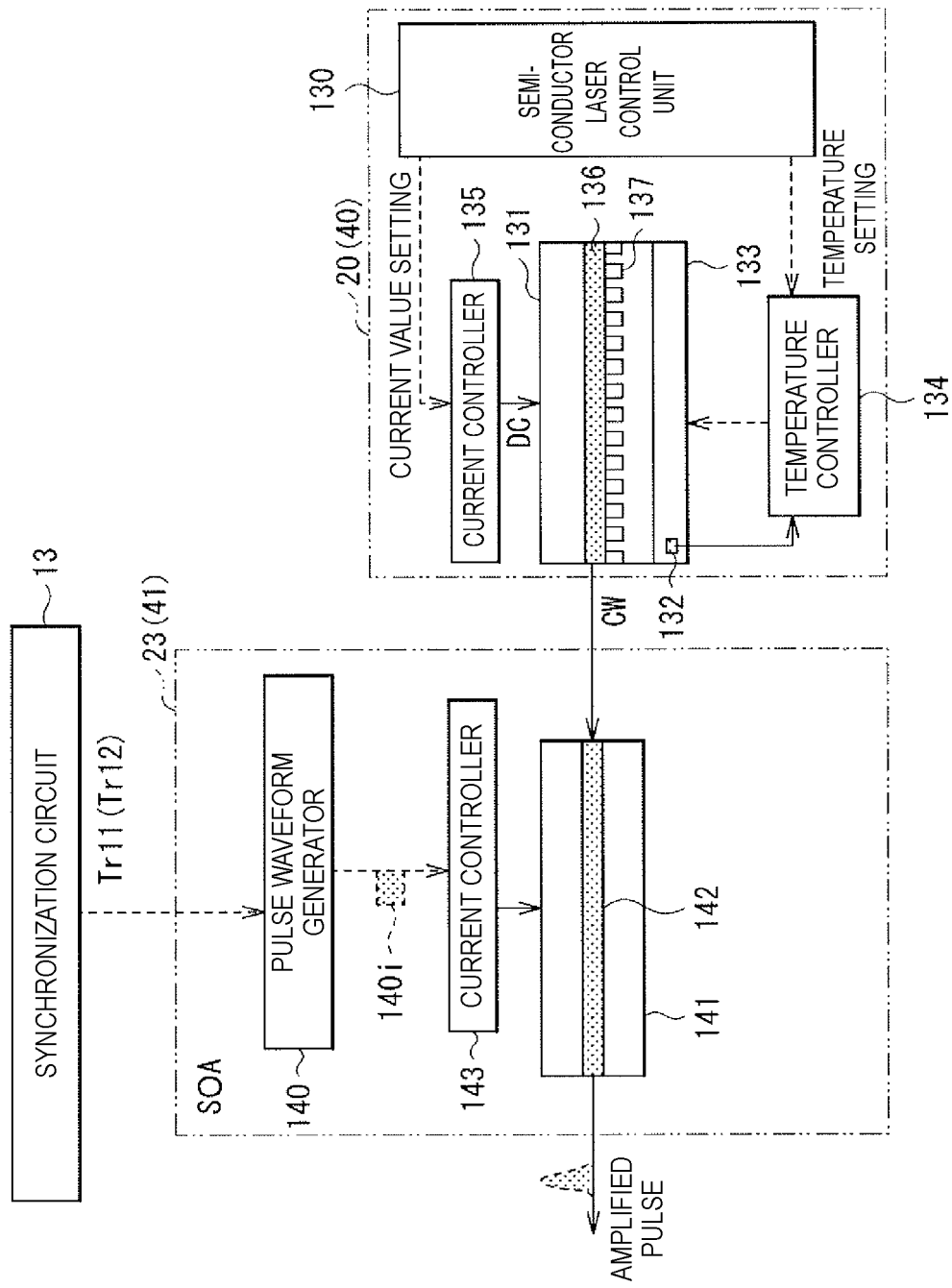
FIG. 15 schematically illustrates exemplary configurations of a first or second semiconductor laser and a first or second semiconductor optical amplifier.

FIG. 15 schematically illustrates exemplary configurations of the first semiconductor laser 20 and the first semiconductor optical amplifier 23. The following description is made on the exemplary configurations of the first semiconductor laser 20 and the first semiconductor optical amplifier 23, but the second semiconductor laser 40 and the second semiconductor optical amplifier 41 may have substantially same configurations.

The first semiconductor laser 20 includes a semiconductor laser control unit 130, a semiconductor element 131, a temperature sensor 132, a Peltier element 133, a temperature controller 134, and a current controller 135. The semiconductor element 131 includes an active layer 136 and a grating 137. For example, the first semiconductor laser 20 may be a distributed-feedback laser configured to perform CW oscillation in a single longitudinal mode.

The first semiconductor optical amplifier 23 includes a semiconductor element 141, a current controller 143, and a pulse waveform generator 140. The semiconductor element 141 includes an active layer 142.

The other configuration may be substantially same as that of the solid-state laser system according to the comparative example or Embodiments 1 to 6.

8.2 Operation

The semiconductor laser control unit 130 sends, to the temperature controller 134, a temperature setting value with which the semiconductor element 131 has a temperature TX corresponding to a desired oscillation wavelength, in this example, a wavelength of 1030 nm approximately.

The temperature controller 134 controls current flowing to the Peltier element 133 so that the temperature sensor 132 has the temperature TX.

The semiconductor laser control unit 130 sends a predetermined current setting value to the current controller 135.

The semiconductor element 131 receives constant current flow and outputs a CW laser beam having a wavelength λ. The CW laser beam is incident on the active layer 142 of the semiconductor element 141 of the first semiconductor optical amplifier 23.

The pulse waveform generator 140 outputs a current control signal 140i having a pulse waveform in accordance with a pulse waveform to be amplified to the current controller 143 in synchronization with the first trigger signal Tr11 received by the synchronization circuit 13. The semiconductor element 141 receives current flow in accordance with the pulse waveform of the current control signal 140i. As a result, a seed beam of the first semiconductor laser 20 is provided with pulse amplification, and accordingly, an amplified pulse laser beam is output from an output side of the semiconductor element 141.

The other operation may be substantially same as that of the solid-state laser system according to the comparative example or Embodiments 1 to 6.

(Others)

An optical shutter as a combination of a polarizer and an EO pockels cell may be used in place of a semiconductor optical amplifier.

The first semiconductor optical amplifier 23 may be omitted from the configuration, and pulse may be generated by a pulsed current signal sent to the current controller 135 of the first semiconductor laser 20. Alternatively, pulse may be generated by a pulsed current signal sent to each of the semiconductor elements 131 and 141 while the first semiconductor laser 20 and the first semiconductor optical amplifier 23 are synchronized with each other.

9. Others

The above description is intended to provide not restriction but examples. Thus, the skilled person in the art would clearly understand that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the appended claims means "at least one" or "one or more".

What is claimed is:

1. A solid-state laser system comprising:
    a first solid-state laser device configured to output a first pulse laser beam having a first wavelength;
    a second solid-state laser device configured to output a second pulse laser beam having a second wavelength;
    a first non-linear crystal disposed on a first optical path through which the first pulse laser beam and the second pulse laser beam travel and configured to perform wavelength conversion of the first pulse laser beam and the second pulse laser beam into a third pulse laser beam having a third wavelength through a sum frequency generation process and output the third pulse laser beam; and
    a second non-linear crystal disposed on a second optical path through which the second pulse laser beam and the third pulse laser beam travel and configured to perform wavelength conversion of the second pulse laser beam and the third pulse laser beam into a fourth pulse laser beam having a fourth wavelength through a sum frequency generation process and output the fourth pulse laser beam,
    the second pulse laser beam being caused to be incident on the second non-linear crystal at a first timing before which the second pulse laser beam is incident on the first non-linear crystal, and residual light of the second pulse laser beam being caused to be incident on the first non-linear crystal at a second timing later than the first timing, the residual light being light not used in the sum frequency generation process and having passed through the second non-linear crystal.

2. The solid-state laser system according to claim 1, wherein the first timing substantially coincides with a timing at which the first pulse laser beam is incident on the first non-linear crystal.

3. The solid-state laser system according to claim 1, wherein the second timing substantially coincides with a timing at which the first pulse laser beam is incident on the first non-linear crystal.

4. The solid-state laser system according to claim 1, wherein a timing at which the first pulse laser beam is incident on the first non-linear crystal is a timing between the first timing and the second timing.

5. The solid-state laser system according to claim 4, wherein a timing at which the first pulse laser beam is incident on the first non-linear crystal is a middle timing between the first timing and the second timing.

6. The solid-state laser system according to claim 1, wherein the second wavelength is 1100 nm to 2000 nm inclusive.

7. The solid-state laser system according to claim 6, wherein the second solid-state laser device includes an Er fiber amplifier.

8. The solid-state laser system according to claim 6, wherein the first wavelength is 220 nm to 400 nm inclusive.

9. The solid-state laser system according to claim 8, wherein the fourth wavelength is 150 nm to 300 nm inclusive.

10. The solid-state laser system according to claim 1, further comprising a first dichroic mirror disposed at a position at which an optical path of the second pulse laser beam and an optical path of the third pulse laser beam intersect each other between the second solid-state laser device and the second non-linear crystal and configured to transmit the second pulse laser beam toward the second non-linear crystal and reflect the third pulse laser beam toward the second non-linear crystal.

11. The solid-state laser system according to claim 10, further comprising:
    a second dichroic mirror disposed on an optical path of the residual light of the second pulse laser beam and configured to reflect the residual light of the second pulse laser beam;
    a reflection mirror disposed on an optical path of the residual light of the second pulse laser beam after being reflected by the second dichroic mirror and configured to reflect the residual light of the second pulse laser beam; and
    a third dichroic mirror disposed at a position at which an optical path of the residual light of the second pulse laser beam after being reflected by the reflection mirror and an optical path of the first pulse laser beam intersect each other and configured to reflect the first pulse laser beam toward the first non-linear crystal and transmit the residual light of the second pulse laser beam toward the first non-linear crystal.

12. The solid-state laser system according to claim 1, further comprising a ½ wave plate disposed between the first non-linear crystal and the second non-linear crystal on an optical path of the residual light of the second pulse laser beam.

13. The solid-state laser system according to claim 12, wherein
    the first solid-state laser device outputs the first pulse laser beam polarized in a first polarization direction,
    the second solid-state laser device outputs the second pulse laser beam polarized in a second polarization direction orthogonal to the first polarization direction, and
    an optical axis of the first non-linear crystal and an optical axis of the second non-linear crystal are orthogonal to each other.

14. A wavelength conversion system comprising:
    a first non-linear crystal disposed on a first optical path through which a first pulse laser beam having a first wavelength and a second pulse laser beam having a second wavelength travel and configured to perform wavelength conversion of the first pulse laser beam and the second pulse laser beam into a third pulse laser beam having a third wavelength through a sum frequency generation process and output the third pulse laser beam; and
    a second non-linear crystal disposed on a second optical path through which the second pulse laser beam and the third pulse laser beam travel and configured to perform wavelength conversion of the second pulse laser beam and the third pulse laser beam into a fourth pulse laser beam having a fourth wavelength through a sum frequency generation process and output the fourth pulse laser beam,
    the second pulse laser beam being caused to be incident on the second non-linear crystal at a first timing before which the second pulse laser beam is incident on the first non-linear crystal, and residual light of the second pulse laser beam being caused to be incident on the first non-linear crystal at a second timing later than the first timing, the residual light being light not used in the sum frequency generation process and having passed through the second non-linear crystal.

* * * * *